US011355071B2

United States Patent
Kim et al.

(10) Patent No.: US 11,355,071 B2
(45) Date of Patent: Jun. 7, 2022

(54) DISPLAY DEVICE

(71) Applicant: Samsung Display Co., LTD., Yongin-si (KR)

(72) Inventors: Tae Hyun Kim, Seoul (KR); Jong Hyun Choi, Seoul (KR); Seung Hwan Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/104,877

(22) Filed: Nov. 25, 2020

(65) Prior Publication Data
US 2021/0319756 A1      Oct. 14, 2021

(30) Foreign Application Priority Data

Apr. 13, 2020 (KR) .......................... 10-2020-0044664

(51) Int. Cl.
*G09G 3/3266* (2016.01)
*G09G 3/3225* (2016.01)
*H01L 27/32* (2006.01)

(52) U.S. Cl.
CPC ......... *G09G 3/3266* (2013.01); *G09G 3/3225* (2013.01); *G09G 2380/02* (2013.01); *H01L 27/3276* (2013.01)

(58) Field of Classification Search
CPC ... G09G 2300/0426; G09G 2310/0281; G09G 3/3225; G09G 3/3233; G09G 2300/0408; G09G 3/3266; H01L 27/3276; G02F 2201/56
See application file for complete search history.

(56) References Cited

U.S. PATENT DOCUMENTS

| 10,551,698 | B2 * | 2/2020 | Koide | G02F 1/13454 |
| 2008/0303776 | A1 * | 12/2008 | Jung | G02F 1/1345 345/100 |
| 2017/0288002 | A1 * | 10/2017 | Kim | H01L 51/0097 |
| 2018/0006105 | A1 | 1/2018 | Kim et al. | |
| 2018/0088393 | A1 * | 3/2018 | Li | G02F 1/133308 |

(Continued)

FOREIGN PATENT DOCUMENTS

| KR | 1020150085668 A | 7/2015 |
| KR | 1020170113066 A | 10/2017 |

(Continued)

OTHER PUBLICATIONS

The European Search Report for EP Application No. 21165432.2 dated Aug. 27, 2021, citing the above reference(s).

*Primary Examiner* — Koosha Sharifi-Tafreshi
(74) *Attorney, Agent, or Firm* — Cantor Colburn LLP

(57) ABSTRACT

A display device includes: a display area including pixels for displaying an image; a non-display area adjacent to the display area; scan lines connected to the pixels; a first scan driver circuit disposed in the non-display area, where the first scan driver circuit is connected to first scan lines among the scan lines, and outputs first scan signals to the first scan lines; and a second scan driver circuit disposed in the non-display area, where the second scan driver circuit is connected to second scan lines among the scan lines, and outputs second scan signals to the second scan lines. The second scan driver circuit is disposed farther away from the display area than the first scan driver circuit is.

24 Claims, 25 Drawing Sheets

(56) References Cited

U.S. PATENT DOCUMENTS

| | | | | |
|---|---|---|---|---|
| 2018/0129106 A1* | 5/2018 | Gao | ................... | G09G 3/3611 |
| 2019/0096978 A1* | 3/2019 | Jung | ................... | G09G 3/3225 |
| 2021/0048699 A1* | 2/2021 | Yamada | ............... | G09G 3/3266 |

FOREIGN PATENT DOCUMENTS

| KR | 1020180030314 A | 3/2018 |
|---|---|---|
| KR | 1020190014361 A | 2/2019 |
| KR | 1020190142796 A | 12/2019 |

\* cited by examiner

DISPLAY DEVICE

This application claims priority to Korean Patent Application No. 10-2020-0044664 filed on Apr. 13, 2020, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

Display devices may be flat panel display devices such as a liquid-crystal display device, a field emission display device, and an organic light-emitting display device. An organic light-emitting display device has various desired characteristics wide viewing angle, high contrast ratio, and fast response speed. In addition, since the organic light-emitting display device may be bent or curved, organic light-emitting display devices are widely used in various electronic devices.

Recently, a display device for displaying images on side portions bent at the four edges of the front surface of an organic light-emitting display device has been studied. Such a display device includes a corner disposed between the first side surface bent at the first side edge of the front surface and the second side surface bent at the second side edge of the front surface. The corner may have a double curvature by the curvature of the first side surface and the curvature of the second side surface.

SUMMARY

Embodiments of the invention provide a display device that may reduce the size of a non-display area at a corner having double curvature.

An embodiment of the invention provides a display device including: a display area including pixels for displaying an image; a non-display area adjacent to the display area; scan lines connected to the pixels; a first scan driver circuit disposed in the non-display area, where the first scan driver circuit is connected to first scan lines among the scan lines, and outputs first scan signals to the first scan lines; and a second scan driver circuit disposed in the non-display area, wherein the second scan driver circuit is connected to second scan lines among the scan lines, and outputs second scan signals to the second scan lines. In such an embodiment, the second scan driver circuit is disposed farther away from the display area than the first scan driver circuit is.

An embodiment of the invention provides a display device includes: a display area in which pixels are disposed; first scan lines connected to first pixels among the pixels; second scan lines connected to second pixels among the pixels; a scan driver circuit connected to the first scan lines and the second scan lines, where the scan driver outputs scan signals to the first scan lines and the second scan lines; and a first supply voltage line disposed between the scan driver circuit and the display area, where the first supply voltage line applies a first supply voltage. In such an embodiment, an area where one of the second scan lines overlaps the first supply voltage line is larger than an area where one of the first scan lines overlaps the first supply voltage line.

An embodiment of the invention provides a display device includes: a display panel including a front surface, a first side surface extended from a first side of the front surface, a second side surface extended from a second side surface of the front surface, and a corner disposed between the first side surface and the second side surface. In such an embodiment, the corner includes: a corner display area where pixels for displaying images are disposed; and a corner auxiliary display area adjacent to the corner display area where the pixels are disposed. In such an embodiment, a number of pixels per unit area in the corner display area is greater than a number of pixels per unit area in the corner auxiliary display area.

BRIEF DESCRIPTION OF THE DRAWINGS

These and/or other features of the invention will become apparent and more readily appreciated by describing in further detail embodiments thereof with reference to the accompanying drawings, in which.

DETAILED DESCRIPTION

Figure 1:
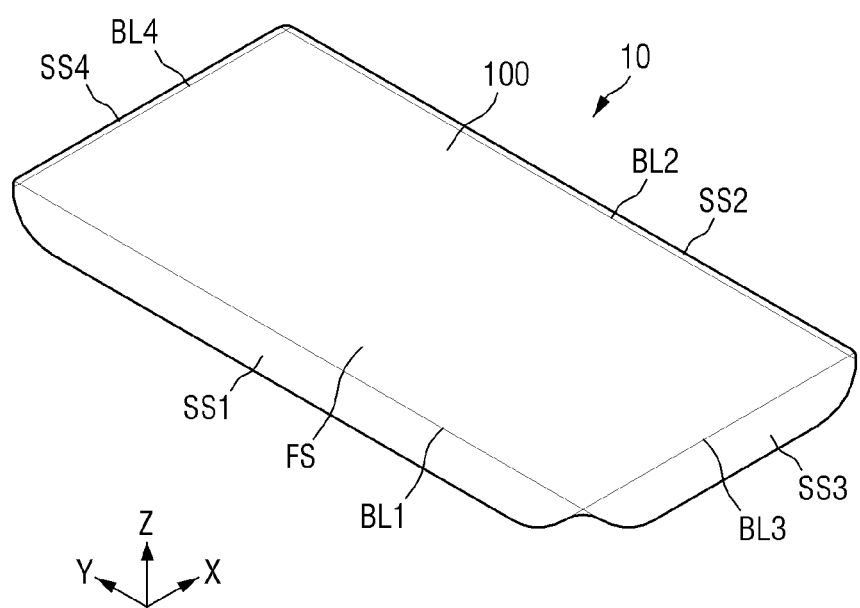
FIG. 1 is a perspective view of a display device according to an embodiment of the disclosure.

The invention will now be described more fully hereinafter with reference to the accompanying drawings, in which embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or nonlinear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a perspective view of a display device according to an embodiment of the disclosure.

A display device 10 according to an embodiment of the disclosure may be employed by portable electronic devices such as a mobile phone, a smart phone, a tablet personal computer ("PC"), a mobile communications terminal, an electronic notebook, an electronic book, a portable multimedia player ("PMP"), a navigation device and an ultra-mobile PC ("UMPC"). Alternatively, the display device 10 may be used as a display unit of a television, a laptop computer, a monitor, an electronic billboard, or the Internet of Things ("IOT"). Alternatively, the display device 10 may be applied to wearable devices such as a smart watch, a watch phone, a glasses-type display, and a head-mounted display ("HMD") device. Alternatively, the display device 10 may be used as a center information display ("CID") disposed at the instrument cluster, the center fascia or the dashboard of a vehicle, as a room mirror display on the behalf of the side mirrors of a vehicle, as a display placed on the back of each of the front seats that is an entertainment system for passengers at the rear seats of a vehicle.

Referring to FIG. 1, an embodiment of the display device 10 includes a display panel 100 displaying an image.

As used herein, a first direction (X-axis direction) may refer to the direction in which the shorter sides of the display panel 100 are extended, for example, the horizontal direction of the display panel 100. A second direction (Y-axis direction) may refer to the direction in which the longer sides of the display panel 100 are extended, for example, the vertical direction of the display panel 100. A third direction (Z-axis direction) may refer to the thickness direction of the display panel 100.

The display panel 100 may be a light-emitting display panel including light-emitting elements. In one embodiment, for example, the display panel 100 may be an organic light-emitting display panel using organic light-emitting diodes including organic emissive layer, a micro light-emitting diode display panel using micro LEDs, a quantum-dot light-emitting display panel including quantum-dot light-emitting diodes including an quantum-dot emissive layer, or an inorganic light-emitting display panel using inorganic light-emitting elements including an inorganic semiconductor. Hereinafter, for convenience of description, embodiments where the display panel 100 is an organic light-emitting display panel will be described in detail, but not being limited thereto.

An embodiment of the display panel 100 includes a front surface FS, a first side surface SS1, a second side surface SS2, a third side surface SS3, and a fourth side surface SS4.

The front surface FS may have, but is not limited to, a rectangular shape having shorter sides in the first direction (X-axis direction) and longer sides in the second direction (Y-axis direction) when viewed from a top (or front) plan view. The front surface FS may have one of other polygonal shape, a circular shape or an oval shape when viewed from the top plan view. Each of the corners of the front surface FS where the short side in the first direction (X-axis direction) meets the longer side in the second direction (Y-axis direction) may be rounded with a predetermined curvature or may be a right angle. The front surface FS may be formed flat or may include a curved surface.

The first side surface SS1 may be extended from a first side of the front surface FS. The first side surface SS1 is bent along a first bending line BL1 on the first side of the front surface FS. The first side surface SS1 may have a first curvature (or a first radius of curvature). The angle formed between the front surface FS and the first side surface SS1 may be approximately 90 degrees or less. The first side of the front surface FS may be the left side of the front surface FS.

The second side surface SS2 may be extended from a second side of the front surface FS. The second side surface SS2 is bent along a second bending line BL2 on the second side of the front surface FS. The second side surface SS2 may have a second curvature (or a second radius of curvature). The second curvature may be substantially equal to or different from the first curvature. The angle formed between the front surface FS and the second side surface SS2 may be approximately 90 degrees or less. The second side of the front surface FS may be the right side of the front surface FS.

The third side surface SS3 may be extended from a third side of the front surface FS. The third side surface SS3 is bent along a third bending line BL3 on the third side of the front surface FS. The third side surface SS3 may have a third curvature (or a third radius of curvature). The angle formed between the front surface FS and the third side surface SS3 may be approximately 90 degrees or less. The third side of the front surface FS may be the lower side of the front surface FS.

The fourth side surface SS4 may be extended from a fourth side of the front surface FS. The fourth side surface SS4 is bent along a fourth bending line BL4 on the fourth side of the front surface FS. The fourth side surface SS4 may have a fourth curvature (or a fourth radius of curvature). The fourth curvature may be substantially equal to or different from the third curvature. The angle formed between the front surface FS and the fourth side surface SS4 may be approximately 90 degrees or less. The fourth side of the front surface FS may be the upper side of the front surface FS.

Figure 2:
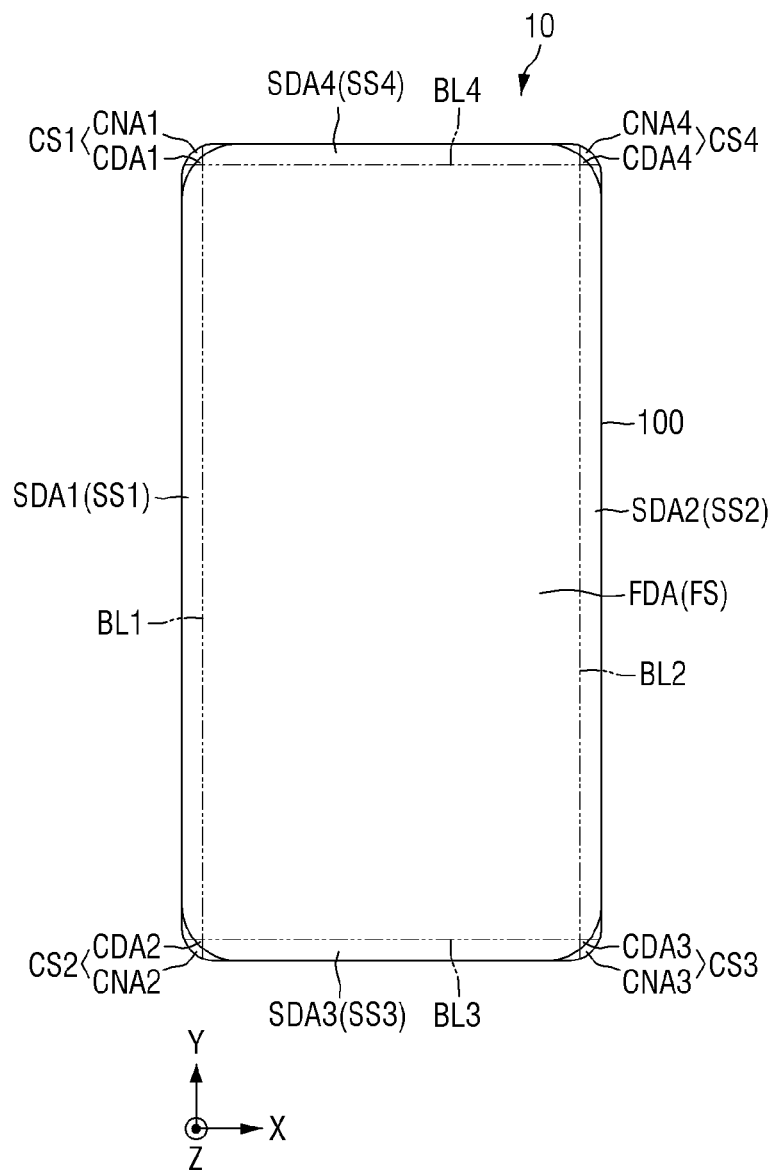
FIG. 2 is a plan view showing a display device according to an embodiment of the disclosure.
Figure 3:
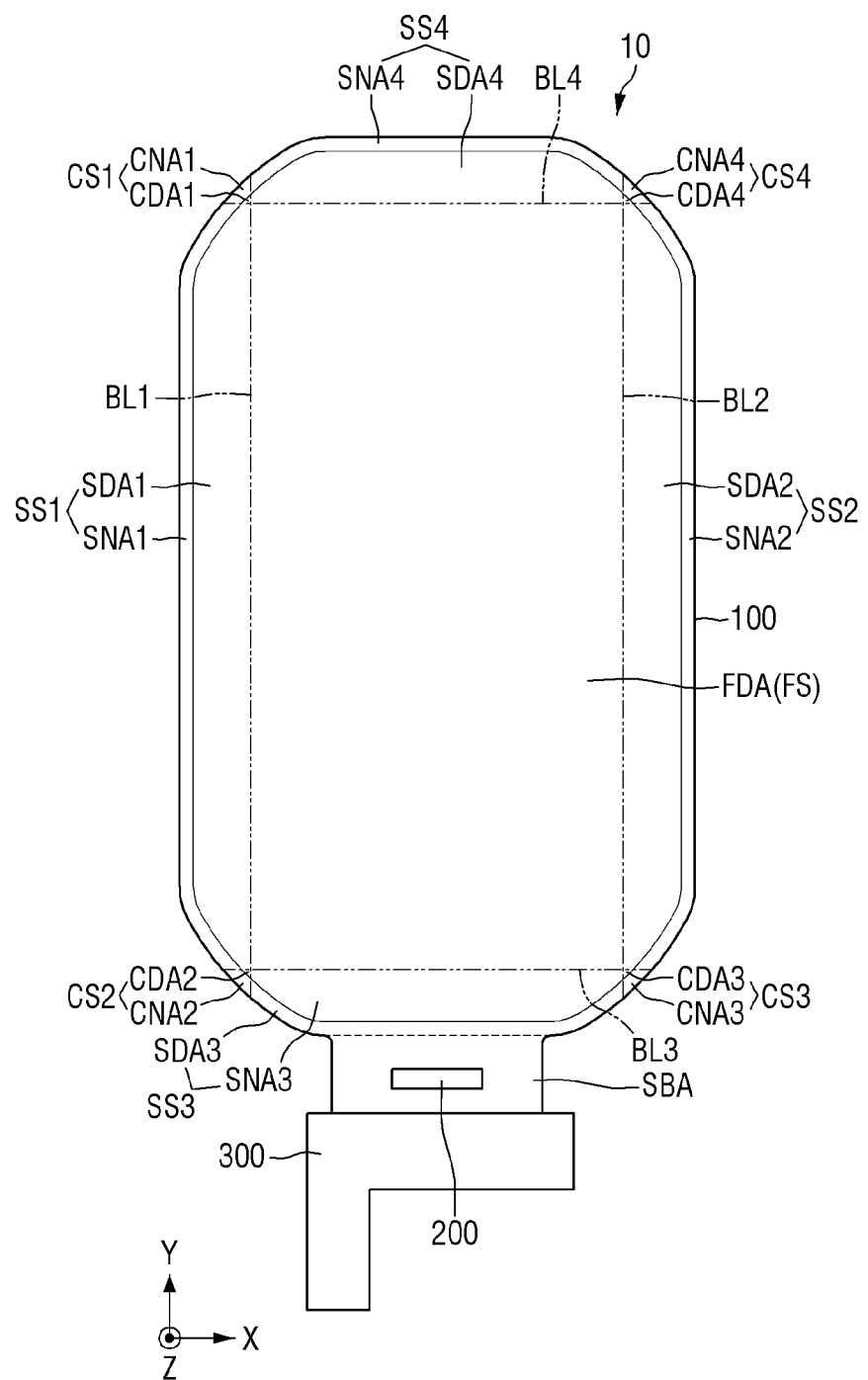
FIG. 3 is a schematic planar figure view showing a display device according to an embodiment of the disclosure.
Figure 4:
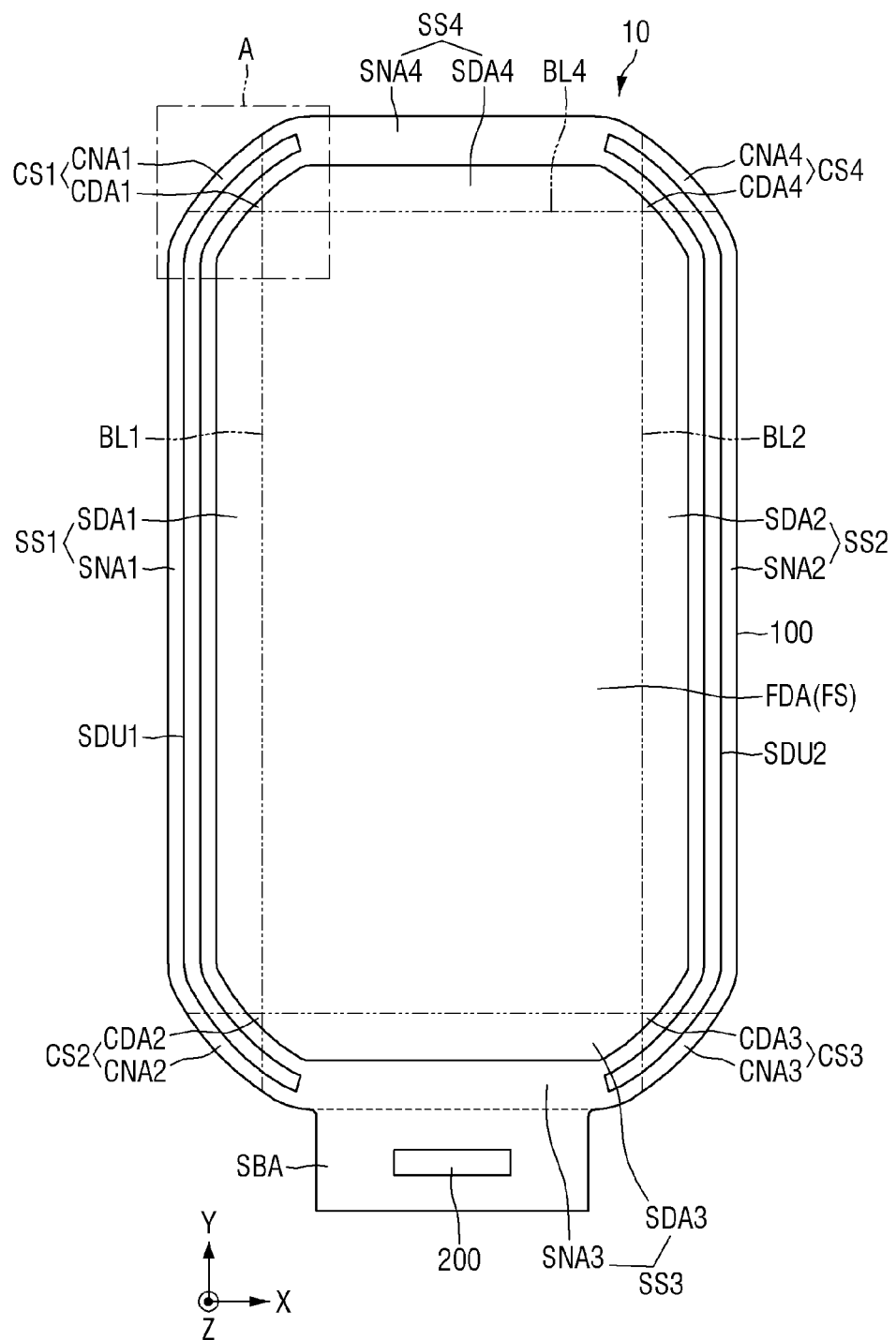
FIG. 4 is a view showing a layout of a display device according to an embodiment of the disclosure.

FIG. 2 is a plan view showing a display device according to an embodiment of the disclosure. FIG. 3 is a schematic planar figure view showing a display device according to an embodiment of the disclosure. FIG. 4 is a view showing a layout of a display device according to an embodiment of the disclosure.

Referring to FIGS. 2 to 4, an embodiment of the display panel 100 may include the front side FS, the first side surface SS1, the second side surface SS2, the third side surface SS3, and the fourth side surface SS4, as well as the first corner CS1 and the second corner CS2, the third corner CS3, and the fourth corner CS4.

The front surface FS of the display panel 100 includes a front display area FDA for displaying an image. The front surface FS may be defined by only the front display area FDA.

The first side surface SS1 includes a first side display area SDA1 for displaying images and a first side non-display area SNA1 for not displaying images. The first side display area SDA1 may be disposed on the left side of the front display area FDA, and the first side non-display area SNA1 may be disposed on the left side of the first side display area SDA1. The first side non-display area SNA1 may be disposed on the left edge of the display panel 100.

The front display area FDA and the first side display area SDA1 may be divided by the first bending line BL1. That is, the front display area FDA may be an area disposed on the right side of the first bending line BL1, and the first side display area SDA1 may be an area disposed on the left side of the first bending line BL1.

The second side surface SS2 includes a second side display area SDA2 for displaying images and a second side non-display area SNA2 for not displaying images. The second side display area SDA2 may be disposed on the right side of the front display area FDA, and the second side non-display area SNA2 may be disposed on the right side of the second side display area SDA2. The second side non-display area SNA2 may be disposed on the right edge of the display panel 100.

The front display area FDA and the second side display area SDA2 may be divided by the second bending line BL2. That is, the front display area FDA may be an area disposed on the right side of the second bending line BL2, and the second side display area SDA2 may be an area disposed on the left side of the second bending line BL2.

The third side surface SS3 includes a third side display area SDA3 for displaying images and a third side non-display area SNA3 for not displaying images. The third side display area SDA3 may be disposed on the lower side of the front display area FDA, and the third side non-display area SNA3 may be disposed on the lower side of the third side display area SDA3. The third side non-display area SNA3 may be disposed on the lower edge of the display panel 100.

The front display area FDA and the third side display area SDA3 may be divided by the third bending line BL3. That is, the front display area FDA may be an area disposed on the upper side of the third bending line BL3, and the third side display area SDA3 may be an area disposed on the lower side of the third bending line BL3.

The fourth side surface SS4 includes a fourth side display area SDA4 for displaying images and a fourth side non-display area SNA4 for not displaying images. The fourth side display area SDA4 may be disposed on the upper side of the front display area FDA, and the fourth side non-display area SNA4 may be disposed on the upper side of the fourth side display area SDA4. The fourth side non-display area SNA4 may be disposed on the upper edge of the display panel 100.

The front display area FDA and the fourth side display area SDA4 may be divided by the fourth bending line BL4. That is, the front display area FDA may be an area disposed on the right side of the fourth bending line BL4, and the fourth side display area SDA4 may be an area disposed on the left side of the fourth bending line BL4.

The first corner CS1 may be disposed between the first side surface SS1 and the fourth side surface SS4. The first corner CS1 may be defined as a corner region bent along the first bending line BL1 and the fourth bending line BL4. Accordingly, the first corner CS1 may have a double curvature by the first curvature of the first side surface SS1 and the fourth curvature of the fourth side surface SS4.

The first corner CS1 includes a first corner display area CDA1 for displaying an image and a first corner non-display area CNA1 for not displaying an image. The first corner display area CDA1 may be disposed at an upper left corner of the front display area FDA, and the first corner non-display area CNA1 may be disposed at an upper left side of the first corner display area CDA1. The first corner non-display area CNA1 may be disposed on the upper left edge of the display panel 100.

The second corner CS2 may be located between the first side portion SS1 and the third side portion SS3. The second corner CS2 may be defined as a corner region bent along the first bending line BL1 and the fourth bending line BL4. Accordingly, the second corner CS2 may have a double curvature by the first curvature of the first side surface SS1 and the third curvature of the third side surface SS3.

The second corner CS2 includes a second corner display area CDA2 for displaying an image and a second corner non-display area CNA2 for not displaying an image. The second corner display area CDA2 may be disposed at a lower left corner of the front display area FDA, and the second corner non-display area CNA2 may be disposed at a lower left side of the second corner display area CDA2. The second corner non-display area CNA2 may be disposed on the lower left edge of the display panel 100.

The third corner CS3 may be disposed between the second side surface SS2 and the third side surface SS3. The third corner CS3 may be defined as a corner region bent along the second bending line BL2 and the third bending line BL3. Accordingly, the third corner CS3 may have a double curvature by the second curvature of the second side surface SS2 and the third curvature of the third side surface SS3.

The third corner CS3 includes a third corner display area CDA3 for displaying an image and a third corner non-display area CNA3 for not displaying an image. The third corner display area CDA3 may be disposed at a lower right corner of the front display area FDA, and the third corner non-display area CNA3 may be disposed at a lower right side of the third corner display area CDA3. The third corner non-display area CNA3 may be disposed on the lower right edge of the display panel 100.

The fourth corner CS4 may be disposed between the second side surface SS2 and the fourth side surface SS4. The fourth corner CS4 may be defined as a corner region bent along the second bending line BL2 and the fourth bending line BL4. Accordingly, the fourth corner CS4 may have a double curvature by the second curvature of the second side surface SS2 and the fourth curvature of the fourth side surface SS4.

The fourth corner CS4 includes a fourth corner display area CDA4 for displaying an image and a fourth corner non-display area CNA4 for not displaying an image. The fourth corner display area CDA4 may be disposed at an upper right corner of the front display area FDA, and the fourth corner non-display area CNA4 may be disposed at an upper right side of the fourth corner display area CDA4. The fourth corner non-display area CNA4 may be disposed on the upper right edge of the display panel 100.

A sub-area SBA may protrude from the lower side of the third side surface SS3 in the second direction (Y-axis direction). The length of the sub-area SBA in the first direction (X-axis direction) may be smaller than the length of the third side surface SS3 in the first direction (X-axis direction). The sub-area SBA may be bent and may be disposed under the side surface SS3 and the front FS.

A display driver circuit 200 and a display circuit board 300 may be disposed in the sub-area SBA.

The display driver circuit 200 may receive control signals and supply voltages through the display circuit board 300, and may generate and output signals and voltages for driving the display panel 100. The display driver circuit 200 may be attached to the sub-area SBA of the display panel 100 by, for example, chip-on-plastic ("COP") technique or ultrasonic technique.

The display circuit board 300 may be a flexible printed circuit board that may be bent, a rigid printed circuit board that is rigid and not bendable, or a hybrid printed circuit board including a rigid printed circuit board and a flexible printed circuit board. The display circuit board 320 may be attached on pads of the sub-area SBA of the display panel 100 using a low-resistance, high-reliability material such as an anisotropic conductive film and self assembly anisotropic conductive paste ("SAP").

In an embodiment, as shown in FIG. 4, a first scan driver SDU1 may be disposed in a first side non-display area SNA1, a third side non-display area SNA3, a fourth side non-display area SNA4, a first corner non-display area CNA1 and a second corner non-display area CNA2 of the display panel 100. The first scan driver SDU1 may output scan signals to the scan lines of the display areas FDA, SDA1, SDA2, SDA3, SDA4, CDA1, CDA2, CDA3 and CDA4 of the display panel 100, and may output emission signals to emission lines. The scan lines and the emission lines will be described in detail with reference to FIG. 5.

In such an embodiment, a second scan driver SDU2 may be disposed in a second side non-display area SNA2, a third side non-display area SNA3, a fourth side non-display area SNA4, a third corner non-display area CNA3 and a fourth corner non-display area CNA4 of the display panel 100. The second scan driver SDU2 may output scan signals to the scan lines of the display areas FDA, SDA1, SDA2, SDA3, SDA4, CDA1, CDA2, CDA3 and CDA4 of the display panel 100, and may output emission signals to emission lines. The first scan driver SDU1 and the second scan driver SDU2 may output the scan signals and the emission signals, which are synchronized with each other.

In an embodiment, as shown in FIGS. 2 to 4, the front surface FS and the side surface SS1, SS2, SS3 and SS4 of the display panel 100 includes display areas FDA, SDA1, SDA2, SDA3 and SDA4 for displaying images, and thus a user may view the images displayed on the front surface FS of the display panel 100 as well as the side surfaces SS1, SS2, SS3 and SS4.

In such an embodiment, when the display device 10 is viewed from a front as shown in FIG. 2, the side surfaces SS1, SS2, SS3 and SS4 are bent from the front surface FS, and accordingly the first side non-display area SNA1 of the first side surface SS1, the second side non-display area SNA2 of the second side surface SS2, the third side non-display area SNA3 of the third side surface SS3, and the fourth side non-display area SNA4 of the fourth side surface SS4 are not visible. However, when the display device 10 is viewed from the front as shown in FIG. 2, the first corner non-display area CNA1 of the first corner CS1, the second corner non-display area CNA2 of the second corner CS2, the third corner non-display area CNA3 of the third corner CS3, and the fourth corner non-display area CNA4 of the fourth corner CS4 may be visible. In such an embodiment, since each of the corners CS1, CS2, CS3 and CS4 has a double curvature, it is difficult to reduce the area of each of the corner non-display areas CNA1, CNA2, CNA3, and CNA4. Since the aesthetic sense of the display device 10 deteriorates due to the corner non-display areas CNA1, CNA2, CNA3 and CNA4, it is desired to reduce the area of each of the corner non-display areas CNA1, CNA2, CNA3 and CNA4.

Figure 5A:
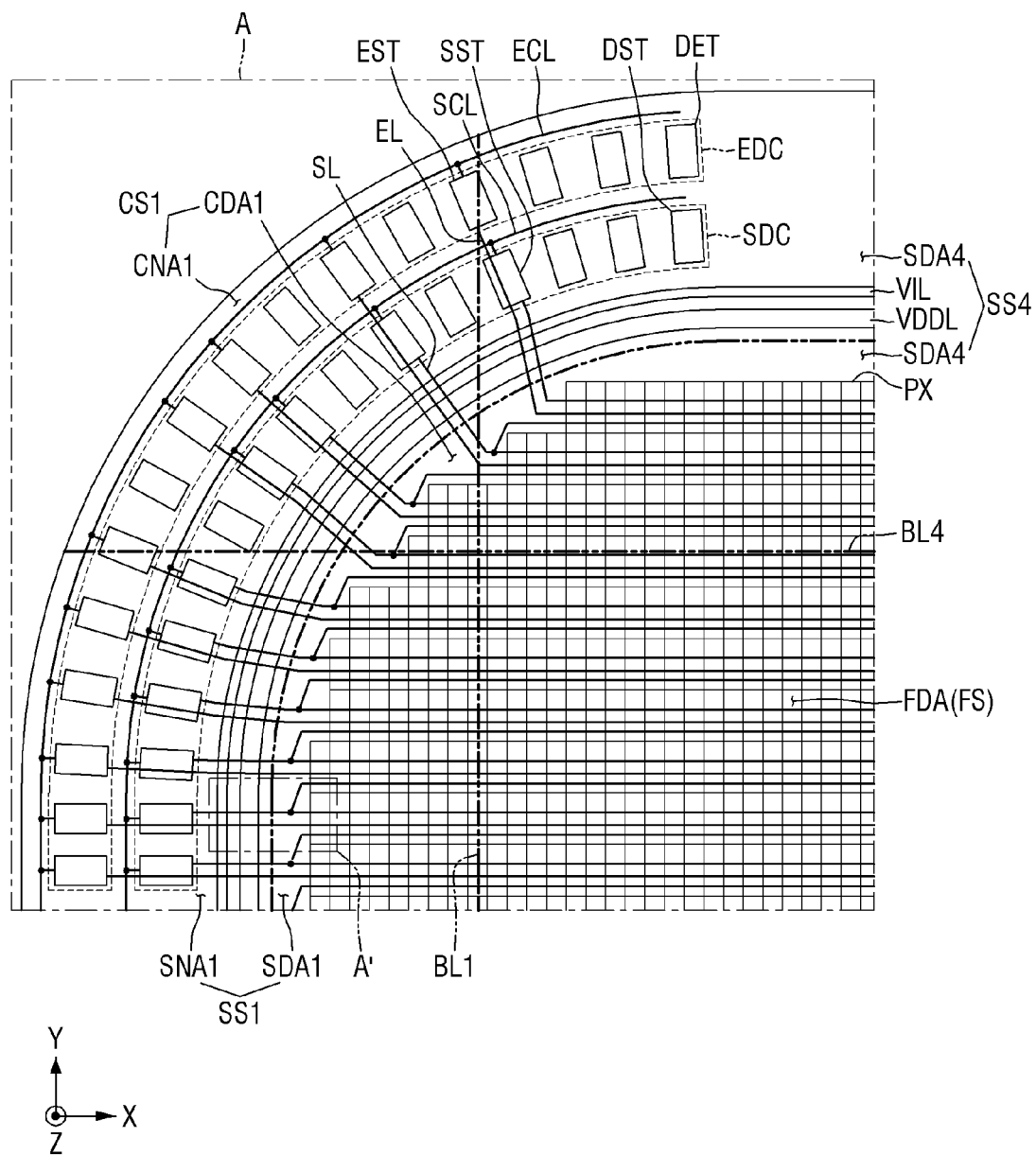
FIG. 5A is an enlarged view showing an embodiment of a layout of area A of FIG. 4 in detail.
Figure 5B:
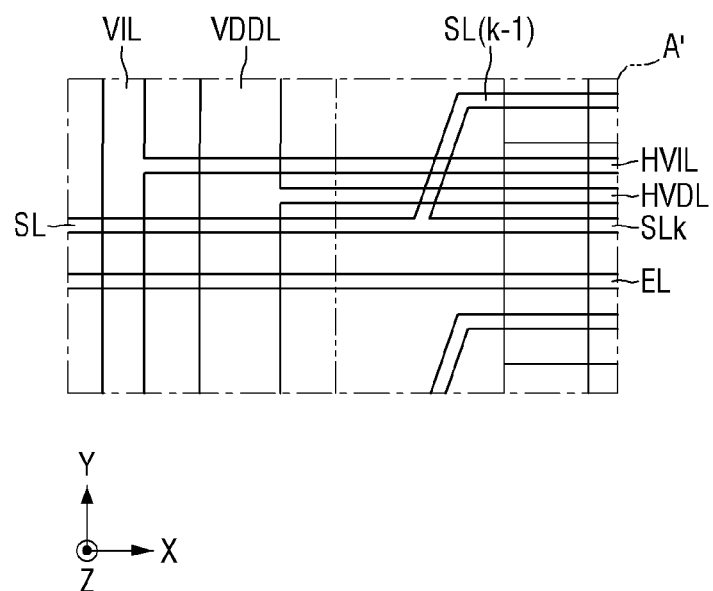
FIG. 5B is an enlarged view showing an embodiment of a layout of area A' of FIG. 5A in detail.

FIG. 5A is an enlarged view showing an embodiment of a layout of area A of FIG. 4 in detail. FIG. 5B is an enlarged view showing an embodiment of a layout of area A' of FIG. 5A in detail. FIG. 5A shows the first corner CS1 of FIG. 4 and surrounding area thereof.

Referring to FIGS. 5A and 5B, the first corner CS1, a part of the first side surface SS1, and a part of the fourth side surface SS4 may be rounded with a predetermined curvature. A part of the first side surface SS1 may be adjacent to the first corner CS1 in the first side portion SS1, and a part of the fourth side surface SS4 may be adjacent to the first corner CS1 in the fourth side surface SS4.

The first corner display area SDA1, the front display area FDA, the first side display area SDA1, and the fourth side display area SDA4 include pixels PX for displaying images. The pixels PX may be arranged in a matrix form arranged in the first direction (X-axis direction) and the second direction (Y-axis direction). The scan lines SL and the emission lines EL may be extended in the first direction (x-axis direction). The scan lines SL and the emission lines EL may be arranged side by side. The data lines may be extended in the second direction (Y-axis direction). The data lines may intersect the scan lines and the emission lines. The data lines are not depicted in FIG. 5A for convenience of illustration. Each of the pixels PX may be connected to, but is not limited to, two scan lines SL, one emission line EL, and one data line intersecting the scan lines SL and the emission line EL.

In an embodiment, a scan driver circuit SDC and an emission driver circuit EDC of the first scan driver SDU1 may be disposed in predetermined areas of the first corner non-display area CNA1, the first side non-display area SNA1, and the fourth side non-display area SNA4. The scan driver circuit SDC includes scan stages SST and dummy scan stages DST, and the emission driver circuit EDC includes emission stages EST and dummy emission stages DET.

The scan stages SST and the dummy scan stages DST of the first scan driver SDU1 may be disposed along the curvature of the first corner CS1 in predetermined areas of the first corner non-display area CNA1, the first side non-display area SNA1, and the fourth side non-display area SNA4.

The scan stages SST may be connected to the scan lines SL, respectively. Each of the scan lines SL may branch off into two scan lines SL. In one embodiment, for example, the $k^{th}$ scan line SLk may branch off into a $(k-1)^{th}$ scan line SL(k-1) and a $k^{th}$ scan line SLk, where k is a positive integer equal to or greater than two. The branched scan lines SL may be arranged side by side in the first direction (X-axis direction). The branched scan lines SL may be connected to different pixels PX.

Each of the scan stages SST may be connected to a scan control line SCL. The scan control line SCL may be disposed between the scan driver circuit SDC and the emission driver circuit EDC. Each of the scan stages SST may generate a scan signal in response to a scan control signal from the scan control line SCL and may output the scan signal to the scan line SL.

Each of the dummy scan stages DST may be disposed between adjacent (or corresponding) ones of the scan stages SST. Alternatively, two or more dummy scan stages DST may be continuously arranged. Each of the dummy scan stages DST is not connected to the scan control line SCL and the scan line SL. That is, each of the dummy scan stages DST does not generate a scan signal and does not output the scan signal to the scan line SL.

In an embodiment where the first corner CS1, a part of the first side surface SS1, and a part of the fourth side surface SS4 are rounded with a predetermined curvature, the space between the scan stages SST may become larger or there may be an empty space between the scan stages SST if the dummy scan stages DST are not disposed. In such a case where the dummy scan stages DST are not disposed or provided, active layers, gate electrodes, source electrodes and drain electrodes of some transistors of the scan stages SST may be over-etched, such that the driving of the scan stages SST of the first corner CS1, a part of the first side surface SS1, and a part of the fourth side surface SS4 may be affected. In such a case, for example, the pulse width of the scan signal output from some of the scan stage SST of the first corner CS1, a part of the first side surface SS1, and a part of the fourth side surface SS4 may be different from scan signals output from the scan stage SST in other areas of the first side surface SS1. The other area of the first side surface SS1 may be an area in which the scan stages SST are arranged in the second direction (Y-axis direction). In an embodiment of the invention, as shown in FIG. 5A, the scan driver circuit SDC includes the dummy scan stages DST, such that the active layers, the gate electrodes, the source electrodes and the drain electrodes of some of the transistors of the scan stages SST in the first corner CS1, a part of the first side surface SS1, and a part of the fourth side surface SS4 are effectively prevented from being excessively etched.

The emission stages EST and the dummy emission stages DET may be disposed along the curvature of the first corner CS1 in the first corner CS1, a part of the first side surface SS1, and a part of the fourth side surface SS4.

The emission stages EST may be connected to the emission lines EL, respectively. The emission lines EL may be connected to the emission stages EST via the scan stages SST, respectively.

Each of the emission stages EST may be connected to an emission control line ECL. The emission control line ECL may be disposed between the emission driver circuit EDC and the edge of the display panel 100. Each of the emission stages EST may generate an emission signal in response to an emission control signal from the emission control line ECL and may output the emission signal to the emission line EL.

Each of the dummy emission stages DET may be disposed between adjacent ones of the emission stages EST. Alternatively, two or more dummy emission stages DET may be continuously arranged. Each of the dummy emission stages DET is not connected to the emission control line ECL and the emission line EL. That is, each of the dummy emission stages DET does not generate an emission signal and does not output the emission signal to the emission line EL.

In an embodiment where the first corner CS1, a part of the first side surface SS1, and a part of the fourth side surface SS4 are rounded with a predetermined curvature, the space between the emission stages EST may become larger or there may be an empty space between the emission stages EST if the dummy emission stages DET are not disposed. In such a case where the dummy emission stages DET are not disposed or provided, active layers, gate electrodes, source electrodes and drain electrodes of some transistors of the emission stages EST may be over-etched, such that the driving of the emission stages EST of the first corner CS1, a part of the first side surface SS1, and a part of the fourth side surface SS4 may be affected. In such a case, for example, the pulse width of the emission signal output from some of the emission stage EST of the first corner CS1, a part of the first side surface SS1, and a part of the fourth side surface SS4 may be different from the pulse width of the emission signal output from the emission stage EST in other areas of the first side surface SS1. In an embodiment of the invention, as shown in FIG. 5A, the emission driver circuit EDC includes the dummy emission stages DET, such that the active layers, the gate electrodes, the source electrodes and the drain electrodes of some of the transistors of the emission stages EST in the first corner CS1, a part of the first side surface SS1, and a part of the fourth side surface SS4 are effectively prevented from being excessively etched.

In an embodiment, a first supply voltage line VDDL and a second supply voltage line VIL may be disposed between the first corner display area CDA1 and the first corner non-display area CNA1, between the first side display area SDA1 and the first side non-display area SNA1, and between the fourth side display area SDA4 and the fourth side non-display area SNA4. The first supply voltage line VDDL and the second supply voltage line VIL may be extended along the curvature of the first corner CS1. Each of the first supply voltage line VDDL and the second supply voltage line VIL may intersect the scan lines SL and the emission lines EL. A first supply voltage may be applied to the first supply voltage line VDDL, and a second supply voltage may be applied to the second supply voltage line VIL.

The first supply voltage line VDDL may include first horizontal supply voltage lines HVDL protruding from the first supply voltage line VDDL and arranged in parallel to the scan lines SL. The second supply voltage line VIL may include second horizontal supply voltage lines HVIL protruding from the second supply voltage line VIL and arranged in parallel to the scan lines SL. The first horizontal supply voltage lines HVDL and the second horizontal supply voltage lines HVIL may be extended in the first direction (X-axis direction). Each of the pixels PX may be connected to the first horizontal supply voltage line HVDL and the second horizontal supply voltage line HVIL and electrically connected to the first supply voltage line VDDL and the second supply voltage line VIL.

In an embodiment, the first supply voltage line VDDL may be disposed closer to the first corner display area CD1 than the second supply voltage line VIL is as shown in FIGS. 5A and 5B. In such an embodiment, the second horizontal supply voltage lines HVIL may intersect the first supply voltage line VDDL.

Since the first scan driver SDU1 disposed in the second corner CS2 is similar to the first scan driver SDU1 disposed in the first corner CS1 described above with reference to FIGS. 5A and 5B, and thus any repetitive detailed description of the first scan driver SDU1 disposed in the second corner CS2 will be omitted. In addition, the second scan driver SDU2 disposed in the third corner CS3 and in the fourth corner CS4 may be substantially to the same the first scan driver SDU1 described above with reference to FIGS. 5A and 5B, and thus any repetitive detailed description of the second scan driver SDU2 disposed in the third corner CS3 and the fourth corner CS4 will be omitted.

Figure 6A:
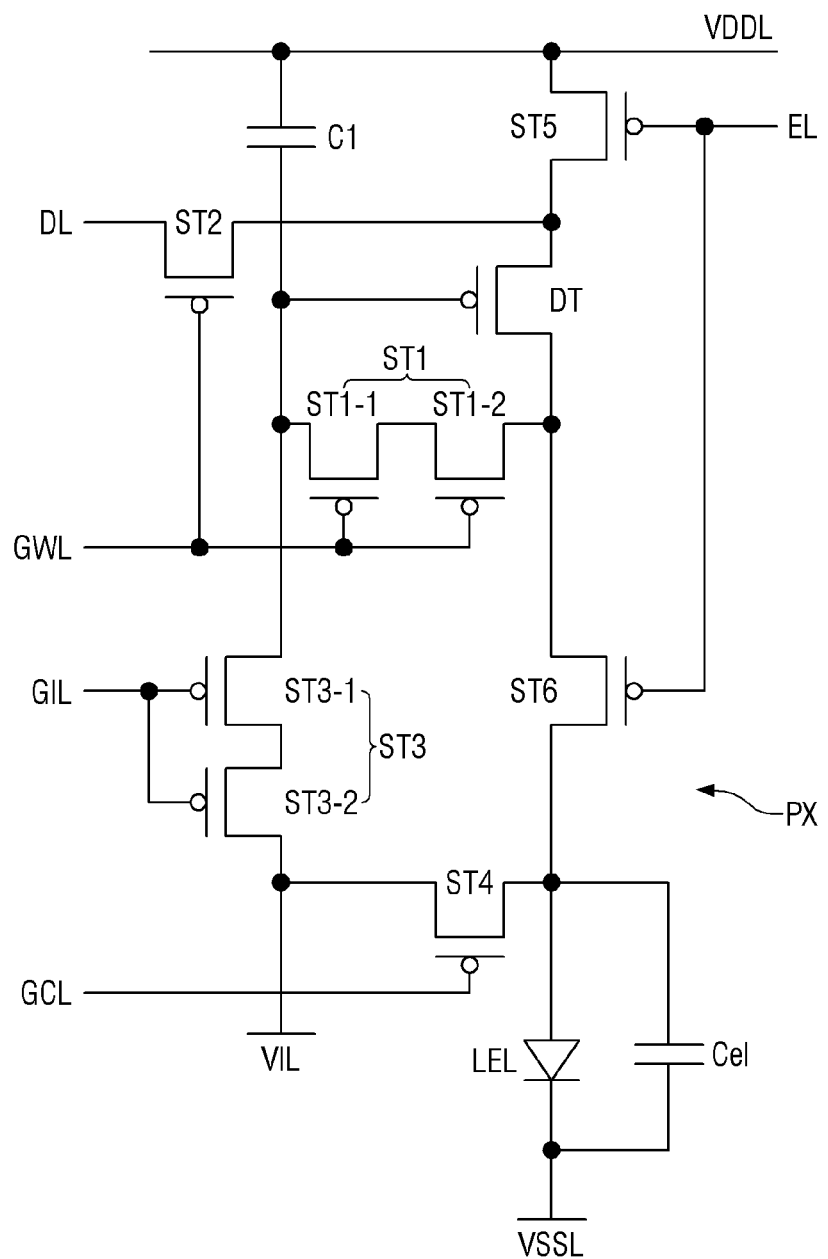
FIG. 6A is a circuit diagram showing an embodiment of the pixel of FIG. 5.

FIG. 6A is a circuit diagram showing an embodiment of the pixel of FIG. 5.

Referring to FIG. 6A, each of the pixels PX may be connected to two of the scan lines SL, one of the emission lines EL, and one of the data lines. In one embodiment, for example, as shown in FIG. 6A, each of the pixels PX may be connected to a write scan line GWL, an initialization scan line GIL, a control scan line GCL, an emission line EL, and a data line DL. According to an embodiment of the disclosure, the write scan line GWL and the control scan line GCL may be the $k^{th}$ scan line SLk of FIG. 5B, and the initialization scan line GIL may be the $(k-1)^{th}$ scan line SL(k−1). It is, however, to be understood that the disclosure is not limited thereto.

The pixel PX includes a driving transistor DT, a light-emitting element LE, switch elements, and a capacitor C1 as shown in FIG. 6A. The switch elements include first to sixth transistors ST1, ST2, ST3, ST4, ST5 and ST6. In an embodiment, as shown in FIG. 6A, the first transistor ST1 may include a first sub-transistor ST1-1 and a second sub-transistor ST1-2, and the third transistor ST3 may include a first sub-transistor ST3-1 and a second sub-transistor ST3-2.

The driving transistor DT includes a gate electrode, a first electrode, and a second electrode. The drain-source current (hereinafter referred to as "driving current") of driving transistor DT flowing between the first electrode and the second electrode is controlled based on the data voltage applied to the gate electrode.

The light-emitting element LEL emits light as the driving current flows therein. The amount of the light emitted from the light-emitting element LEL may be proportional to the driving current.

The light-emitting element LEL may be an organic light-emitting diode including an anode electrode, a cathode electrode, and an organic emissive layer disposed between the anode electrode and the cathode electrode. Alternatively, the light-emitting element LEL may be an inorganic light-emitting element including an anode electrode, a cathode electrode, and an inorganic semiconductor disposed between the anode electrode and the cathode electrode. Alternatively, the light-emitting element LEL may be a quantum-dot light-emitting element including an anode electrode, a cathode electrode, and a quantum-dot emissive layer disposed between the anode electrode and the cathode electrode. Alternatively, the light-emitting element LEL may be a micro light-emitting diode.

The anode electrode of the light-emitting element LEL may be connected to the first electrode of the fourth transistor ST4 and the second electrode of the sixth transistor ST6, while the cathode electrode thereof may be connected to the third supply voltage line VSSL. A parasitic capacitance Cel may be formed between the anode electrode and the cathode electrode of the light-emitting element LEL.

The capacitor C1 is connected between the second electrode of the driving transistor DT and the first supply voltage line VDDL. One electrode of the capacitor C1 may be connected to the second electrode of the driving transistor DT while the other electrode thereof may be connected to the first supply voltage line VDDL.

In an embodiment, where the first electrode of each of the first to sixth transistors ST1, ST2, ST3, ST4, ST5 and ST6 and the driving transistor DT is a source electrode, the second electrode thereof may be a drain electrode. Alternatively, the first electrode of each of the first to sixth transistors ST1, ST2, ST3, ST4, ST5 and ST6 and the driving transistor DT is a drain electrode, and the second electrode thereof may be a source electrode.

The active layer of each of the first to sixth transistors ST1, ST2, ST3, ST4, ST5 and ST6 and the driving transistor DT may include or be made of one of poly silicon, amorphous silicon and oxide semiconductor. In an embodiment, where the semiconductor layer of each of the first to sixth transistors ST1 to ST6 and the driving transistor DT includes or is made of poly silicon, a low-temperature poly silicon ("LTPS") process may be employed.

Although the first to sixth transistors ST1, ST2, ST3, ST4, ST5 and ST6 and the driving transistor DT are of p-type metal oxide semiconductor field effect transistors ("MOSFET"s) as shown in FIG. 6A, this is merely exemplary. Alternatively, the first to sixth transistors ST1, ST2, ST3, ST4, ST5 and ST6 and the driving transistor DT may be of n-type MOSFETs.

In an embodiment, a first supply voltage from the first supply voltage line VDDL, a second supply voltage from the second supply voltage line VIL, and a third supply voltage from the third supply voltage line VSSL may be determined based on the characteristics of the driving transistor DT, the characteristics of the light-emitting element LEL.

Figure 6B:
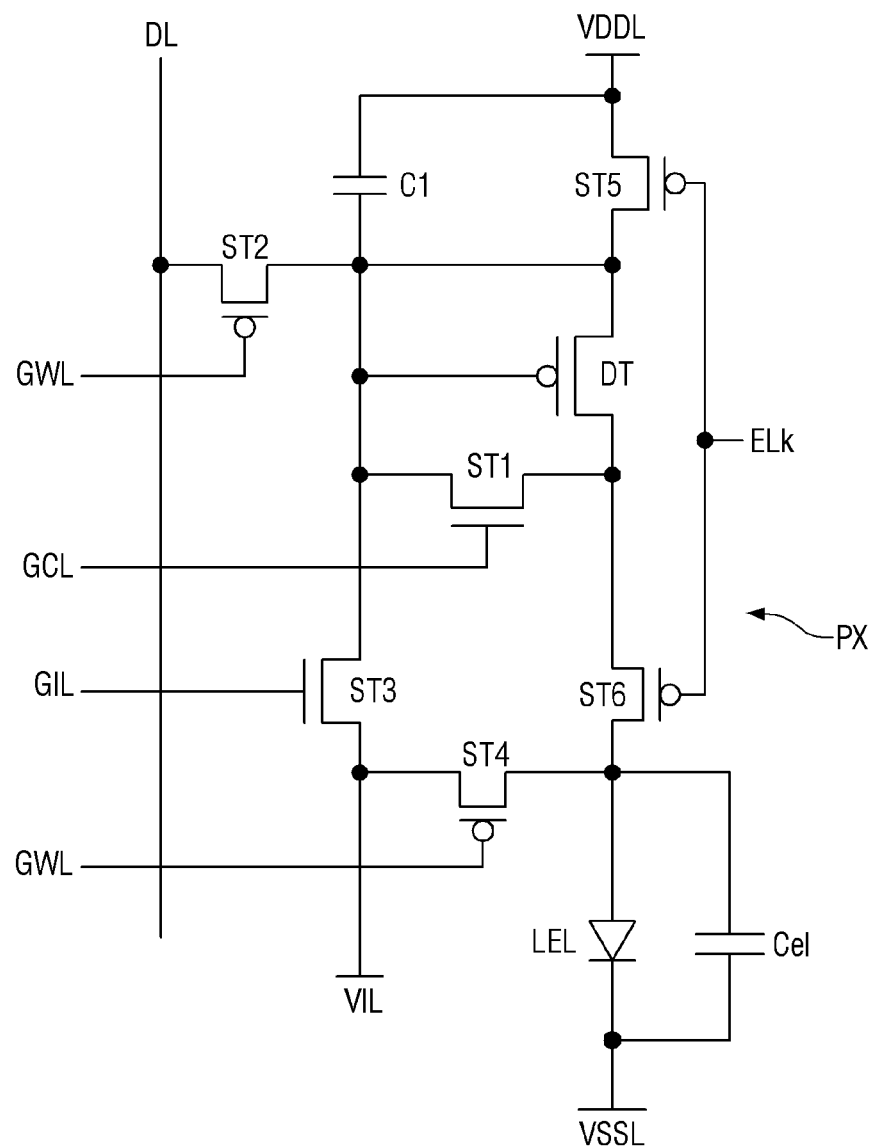
FIG. 6B is a circuit diagram showing an alternative embodiment of the pixel of FIG. 5.

FIG. 6B is a circuit diagram showing an alternative embodiment of the pixel of FIG. 5.

The embodiment of FIG. 6B is substantially the same as the embodiment of FIG. 6A except that the driving transistor DT, the second transistor ST2, the fourth transistor ST4, the fifth transistor ST5 and the sixth transistor ST6 are implemented as p-type MOSFETs, and the first transistor ST1 and the third transistor ST3 are each defined by a single transistor implemented as n-type MOSFETs.

Referring to FIG. 6B, the active layer of each of the driving transistor DT, the second transistor ST2, the fourth transistor ST4, the fifth transistor ST5 and the sixth transistor ST6 implemented as p-type MOSFETs may include or be made of polysilicon, and the active layer of the first transistor ST1 and the third transistor ST3 implemented as n-type MOSFETs may include or be made of oxide semiconductor. In such an embodiment, since transistors including or formed of polysilicon and transistors including or formed of an oxide semiconductor may be disposed on different layers, the area of the pixel PX may be reduced.

The embodiment of FIG. 6B is substantially the same as the embodiment of FIG. 6A except that the gate electrode of the second transistor ST2 and the gate electrode of the fourth transistor ST4 are connected to the write scan line GWL, and the gate electrode of the first transistor ST1 is connected to the control scan line GCL. In an embodiment, as shown in FIG. 6B, since the first transistor ST1 and the third transistor ST3 are n-type MOSFETs, a scan signal of a gate-high voltage may be applied to the control scan line GCL and the initialization scan line GIL. In such an embodiment, since the second transistor ST2, the fourth transistor ST4, the fifth transistor ST5 and the sixth transistor ST6 are p-type MOSFETs, a scan signal of a gate-low voltage may be applied to the write scan line GWL and the emission line EL.

Figure 7:
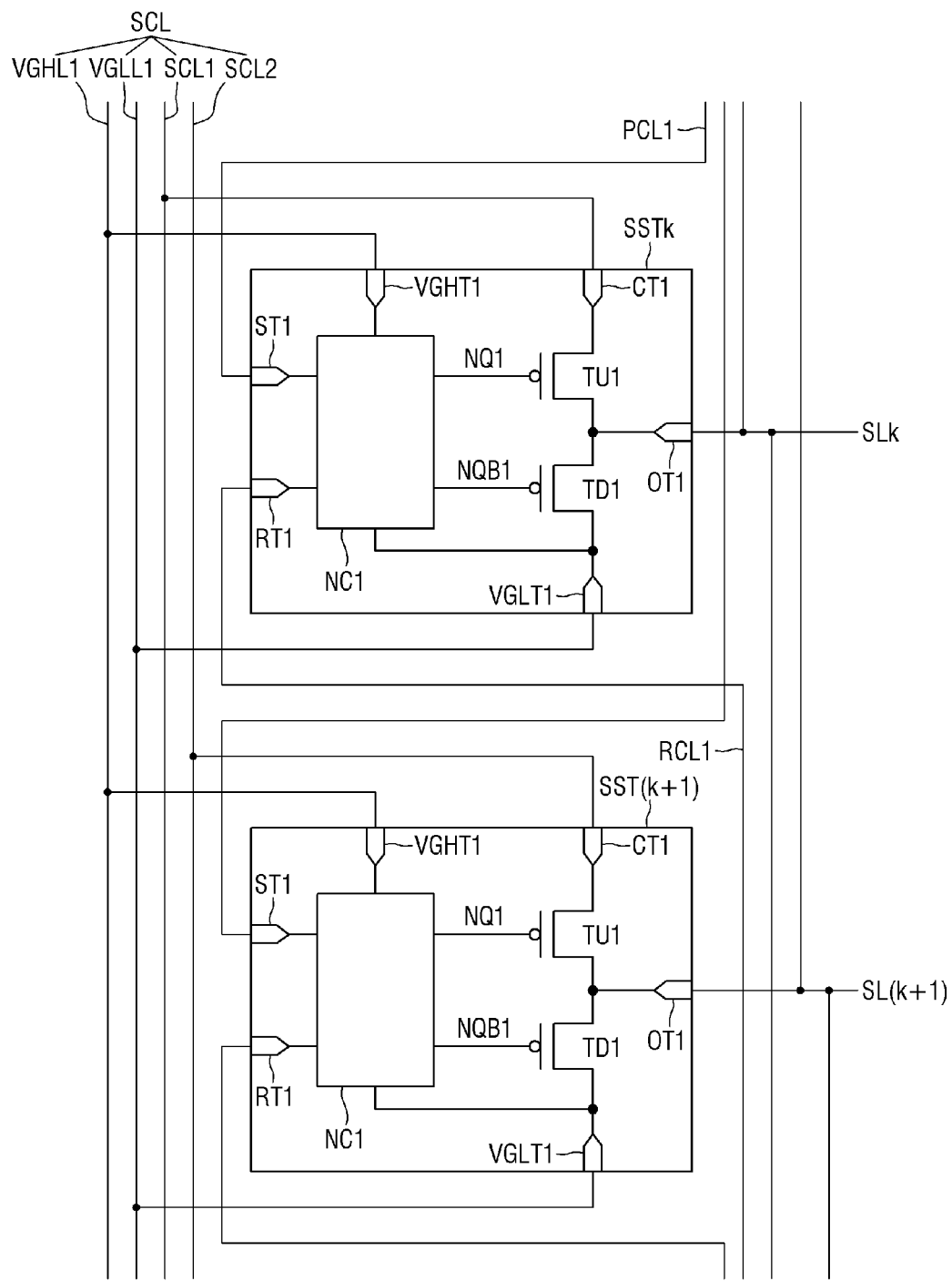
FIG. 7 is a circuit diagram showing an embodiment of the scan driver circuit of FIG. 5.

FIG. 7 is a circuit diagram showing an embodiment of the scan driver circuit of FIG. 5A.

For convenience of illustration, FIG. 7 shows only a $k^{th}$ scan stage SSTk connected to a $k^{th}$ scan line SLk, and a $(k+1)^{th}$ scan stage SST(k+1) connected to a $(k+1)^{th}$ scan line SL(k+1).

Referring to FIG. 7, an embodiment of the scan driver circuit SDC includes scan stages SSTk and SST(k+1) that are cascadedly connected to each other. The scan stages SSTk and SST(k+1) may sequentially output scan signals. In one embodiment, for example, the $k^{th}$ scan stage SSTk may be connected to the $k^{th}$ scan line SLk to output a $k^{th}$ scan signal. The (k+1) scan stage SST(k+1) may be connected to the (k+1) scan line SL(k+1) to output a (k+1) scan signal.

Each of the scan stages SSTk and SST(k+1) includes a first pull-up node NQ1, a first pull-down node NQB1, a first pull-up transistor TU1 that is turned on when the first pull-up node NQ1 have a first gate-on voltage, a first pull-down transistor TD1 that is turned on when the first pull-down node NQB1 has a first gate-on voltage, and a first node controller NC1 that controls charging and discharging of the first pull-up node NQ1 and the first pull-down node NQB1. The scan control lines SCL connected to the scan stages SSTk and SST(k+1) include a scan start signal line from which a scan start signal is applied, scan clock lines SCL1 and SCL2 from which the scan clock signals are applied, a first gate-on voltage line VGHL1, and a first gate-off voltage line VGLL1.

Each of the scan stages SSTk and SST(k+1) includes a first start terminal ST1, a first reset terminal RT1, a first gate-on voltage terminal VGHT1, a first gate-off voltage terminal VGLT1, a first clock terminal CT1, and a first output terminal OT1. The first start terminal ST1 may be connected to a scan start line to which a scan start signal is applied or a first previous stage carry line PCL1 to which an output signal from the previous stage is applied. The first reset terminal RT1 may be connected to a first rear stage carry line RCL1 to which the output signal from the rear stage is input. The first gate-on voltage terminal VGHT1 may be connected to a first gate-on voltage line VGHL1 to which the first gate-on voltage is applied. The first gate-off voltage terminal VGLT1 may be connected to the first gate-off voltage line VGLL1 to which the gate-off voltage is applied. The first gate-on voltage may be a first level voltage, and the first gate-off voltage may be a second level voltage. The first node controller NC1 includes a plurality of thin-film transistors.

The first clock terminal CT1 may be connected to either a first scan clock line SCL1 to which the scan clock signal is applied or a second scan clock line SCL2 to which the second scan clock signal is applied. The stages SSTk and SST(k+1) may be alternately connected to the first scan clock line SCL1 and the second scan clock line SCL2. In one embodiment, for example, where the first clock terminal CT1 of the $k^{th}$ scan stage SSTk is connected to the first scan clock line SCL1, the first clock terminal CT1 of the $(k+1)^{th}$ scan stage SST(k+1) may be connected to the second scan clock line SCL2. FIG. 7 shows an embodiment where the stages SSTk and SST(k+1) are alternately connected to the two scan clock lines SCL1 and SCL2, but the disclosure is not limited thereto. In one alternative embodiment, for example, the stages SSTk and SST(k+1) may be alternately connected to three or more scan clock lines.

The first output terminal OT1 may be connected to one of the scan lines SLk and SL(k+1). The stages SSTk and SST(k+1) may be sequentially connected to the scan lines SLk and SL(k+1). In one embodiment, for example, the first output terminal OT1 of the $k^{th}$ stage SSTk may be connected to the $k^{th}$ scan line SLk, and the first output terminal OT1 of the $(k+1)^{th}$ stage SST(k+1) may be connected to the $(k+1)^{th}$ scan line SL(k+1).

In an embodiment, the first pull-up transistor TU1, the first pull-down transistor TD1, and a plurality of transistors of the first node controller NC1 of each of the stages SSTk and SST(k+1) are p-type MOSFETs as shown in FIG. 7, but embodiments of the disclosure are not limited thereto. Alternatively, the first pull-up transistor TU1, the first pull-down transistor TD1 and the plurality of transistors of the first node controller NC1 of each of the stages SSTk and SST(k+1) may be n-type MOSFETs.

Figure 8:
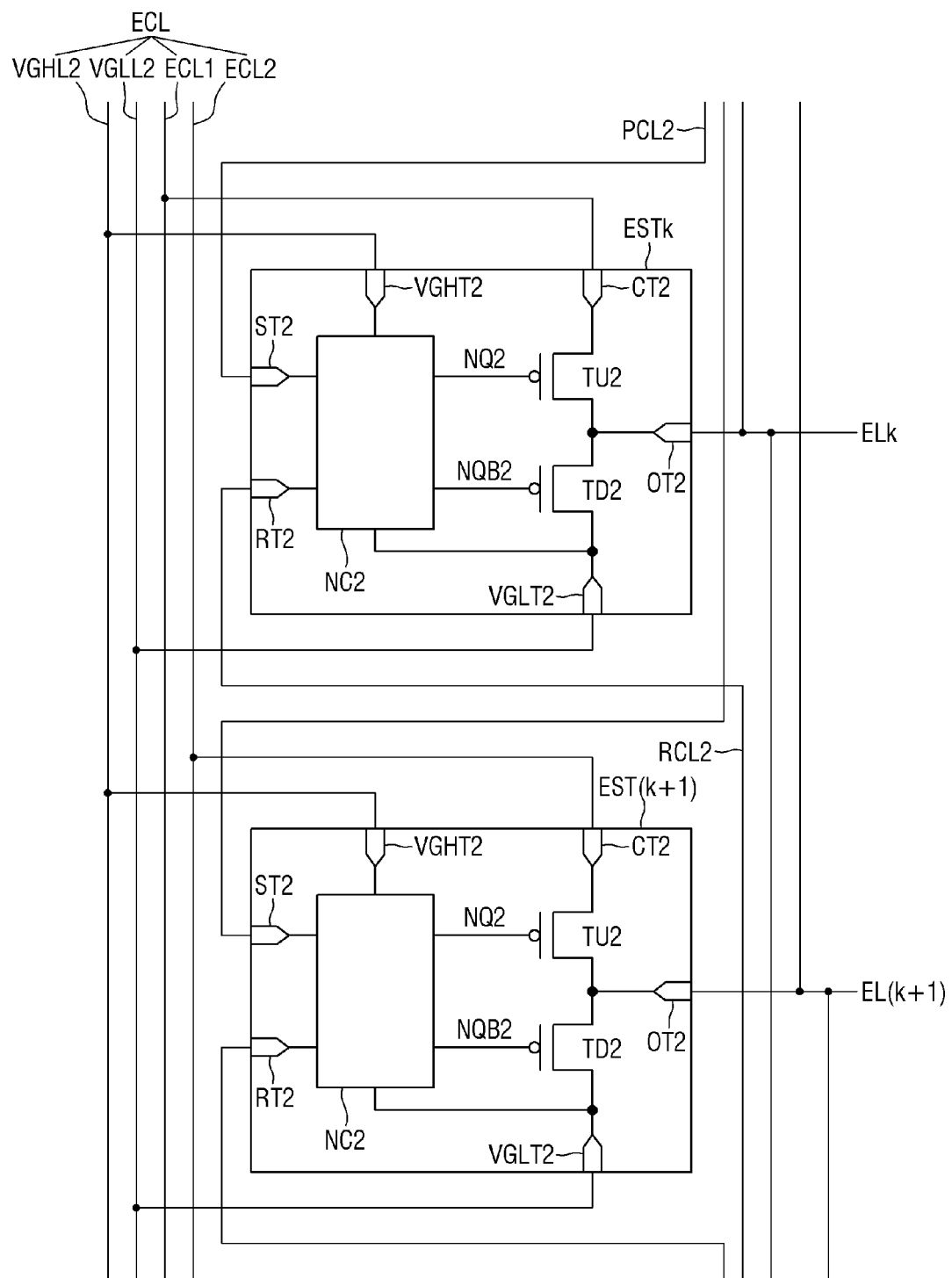
FIG. 8 is a circuit diagram showing an embodiment of the emission driver circuit of FIG. 5.

FIG. 8 is a circuit diagram showing an embodiment of the emission driver circuit of FIG. 5A.

For convenience of illustration, FIG. 8 shows only a $k^{th}$ emission stage ESTk connected to a $k^{th}$ emission line ELk, and a $(k+1)^{th}$ emission stage EST(k+1) connected to a $(k+1)^{th}$ emission stage EL(k+1) of the emission driver circuit EDC.

Referring to FIG. 8, the emission driver circuit EDC includes emission stages ESTk and EST(k+1) that are cascadedly connected to each other. The emission stages ESTk and EST(k+1) may sequentially output emission signals. In one embodiment, for example, the $k^{th}$ emission stage ESTk may be connected to the $k^{th}$ emission line ELk to output the $k^{th}$ emission signal. The $(k+1)^{th}$ emission stage EST(k+1) may be connected to the $(k+1)^{th}$ emission line EL(k+1) to output a $(k+1)^{th}$ emission signal.

In an embodiment, as shown in FIG. 8, each of the emission stages ESTk and EST(k+2) includes a second pull-up node NQ2, a second pull-down node NQB2, a second pull-up transistor TU2 that is turned on when the second pull-up node NQ2 have a second gate-on voltage, a second pull-down transistor TD2 that is turned on when the second pull-down node NQB2 has a second gate-on voltage, and a second node controller NC2 that controls charging and discharging of the second pull-up node NQ2 and the second pull-down node NQB2. The emission control lines ECL connected to the emission stages ESTk and EST(k+1) include an emission start signal line to which an emission start signal is applied, emission clock lines ECL1 and ECL2 to which the emission clock signals are applied, a second gate-on voltage line VGHL2, and a second gate-off voltage line VGLL2.

Each of the emission stages ESTk and EST(k+1) includes a second start terminal ST2, a second reset terminal RT2, a second gate-on voltage terminal VGHT2, a second gate-off voltage terminal VGLT2, a second clock terminal CT2, and a second output terminal OT2. The second start terminal ST2 may be connected to a scan start line to which a scan start signal is applied or a second previous stage carry line PCL2 to which an output signal from the previous stage is applied. The second reset terminal RT1 may be connected to a second rear stage carry line RCL2 to which the output signal from the rear stage is input. The emission stages ESTk and EST(k+1) are substantially the same as the scan stages SSTk and SST(k+1) described above with reference to FIG. 7 except that they receive an emission start signal different from the scan start signal, and an emission clock signal different from the scan clock signal; and, therefore, any repetitive detailed description thereof will be omitted.

In such an embodiment, since the first non-display area CNA1 may deteriorate the aesthetic appeal of the display device 10, it is desired to reduce the area of the first corner non-display area CNA1. It is, however, difficult to reduce the area of the first corner non-display area CNA1 because the scan driver circuit SDC and the emission driver circuit EDC are disposed in the first corner non-display area CNA1, leaving almost no space. Hereinafter, an embodiment where the first corner non-display area CNA1 is reduced and the area of the first corner display area CDA1 is increased in the first corner part CS1 will be described in detail.

Figure 9A:
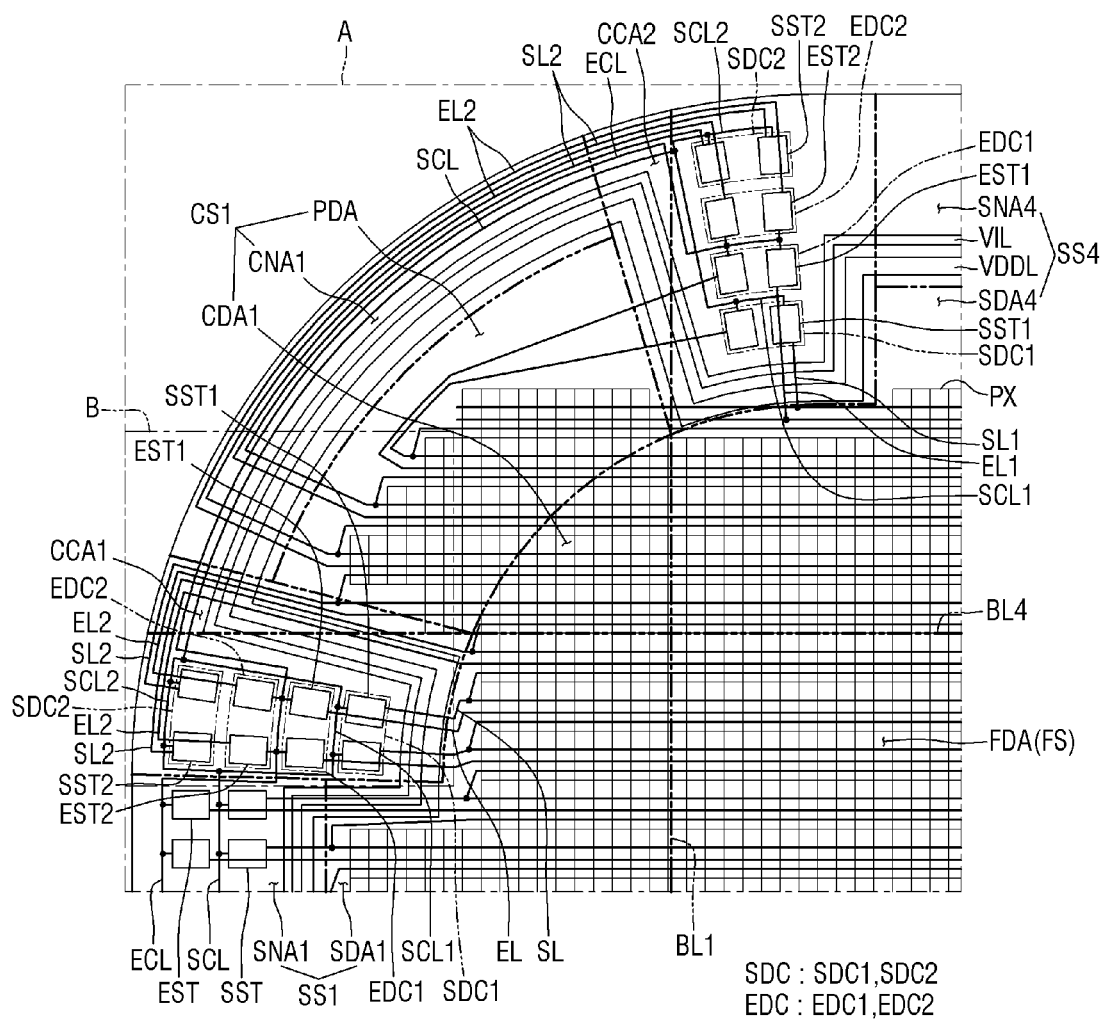
FIG. 9A is a view showing a layout of a first corner according to an alternative embodiment.
Figure 9B:
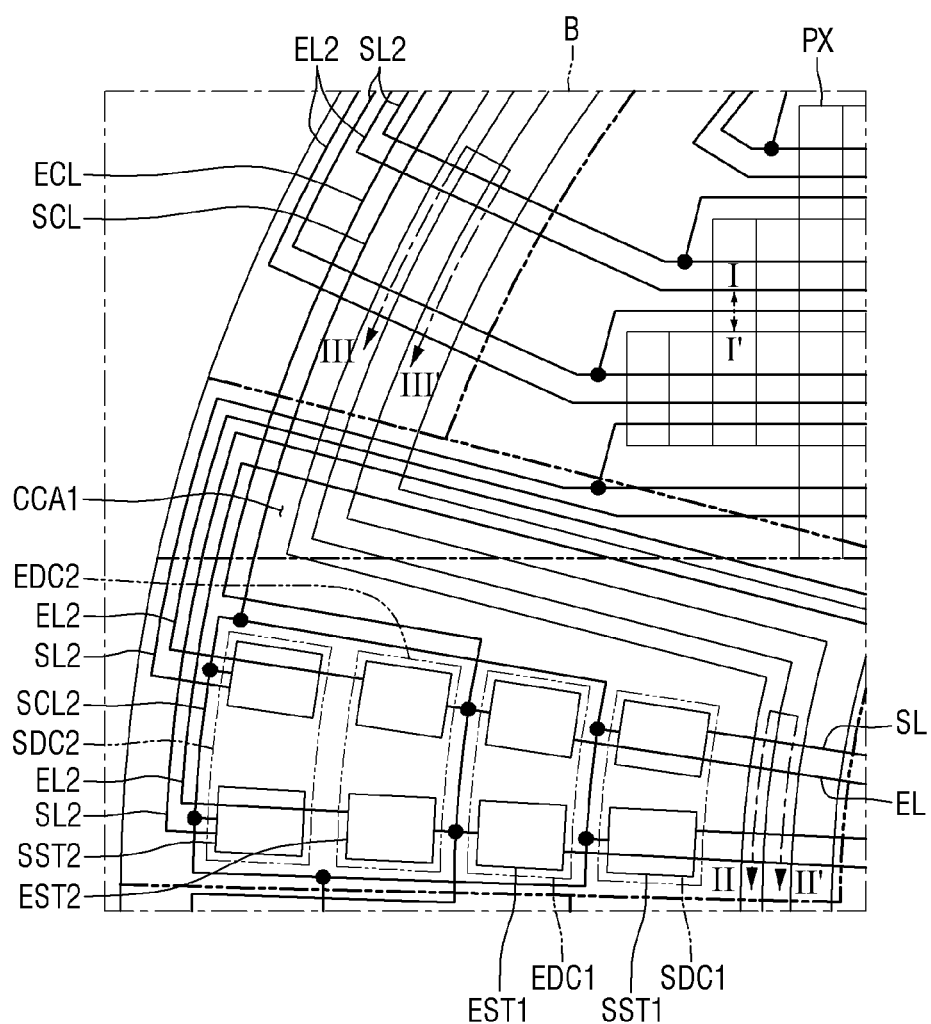
FIG. 9B is an enlarged view showing a layout of area B of FIG. 9A in detail.

FIG. 9A is a view showing a layout of a first corner according to an alternative embodiment. FIG. 9B is an enlarged view showing a layout of area B of FIG. 9A in detail.

Referring to FIGS. 9A and 9B, an embodiment of the display panel 100 further includes a first circuit area CCA1 disposed between the first side non-display area SNA1 and the first corner non-display area CNA1, and a second circuit area CCA2 disposed between the fourth side non-display area SNA4 and the first corner non-display area CNA1. In such an embodiment, the first corner CS1 includes a first corner display area SDA1, a protruding display area PDA, and a first corner non-display area CNA1.

Each of the first circuit area CCA1 and the second circuit area CCA2 is a non-display area that does not display an image. In an embodiment, a first scan driver circuit SDC1 and a second scan driver circuit SDC2 of the scan driver circuit SDC, and a first emission driver circuit EDC1 and a second emission driver circuit EDC2 of the emission driver circuit EDC are disposed in each of the first circuit area CCA1 and the second circuit area CCA2.

In an embodiment, the first scan driver circuit SD1 may be disposed closer to the first corner display area CDA1 and the protruding display area PDA than the second scan driver circuit SDC2 is. In such an embodiment, the second scan driver circuit SD2 may be disposed farther from the first corner display area CDA1 and the protruding display area PDA than the first scan driver circuit SDC1 is.

In an embodiment, the first emission driver circuit EDC1 may be disposed closer to the first corner display area CDA1 and the protruding display area PDA than the second scan driver circuit SDC2 is. In such an embodiment, the second emission driver circuit EDC2 may be disposed farther from the first corner display area CDA1 and the protruding display area PDA than the first emission driver circuit EDC1 is.

The first scan driver circuit SDC1 may be disposed at the innermost position, and the second scan driver circuit SDC2 may be disposed at the outermost position. The first emission driver circuit EDC1 and the second emission driver circuit EDC2 may be disposed between the first scan driver circuit SD1 and the second scan driver circuit SDC2. The first emission driver circuit EDC1 may be disposed adjacent to the first scan driver circuit SD1, and the second emission driver circuit EDC2 may be disposed adjacent to the second scan driver circuit SDC2.

A first scan control line SCL1 may be disposed between the first scan driver circuit SDC1 and the first emission driver circuit EDC1. An emission control line ECL may be disposed between the first emission driver circuit EDC1 and the second emission driver circuit EDC2. No additional control line may be disposed between the second emission driver circuit EDC2 and the second scan driver circuit SDC2. A second scan control line SCL2 may be disposed between the second scan driver circuit SDC2 and the edge of the display panel 100. The first scan control line SCL1 and the second scan control line SCL2 may branch off from a scan control line SCL and then combined or merged back into the scan control line SCL.

The first scan driver circuit SDC1 includes first scan stages SST1, and the second scan driver circuit SDC2 includes second scan stages SST2.

The first scan stages SST1 may be connected to first scan lines SL1 connected to the pixels PX of the first side display area SDA1 and the second side display area SDA2, respectively. The scan lines SL connected to the first scan stages SST1 may be defined as first scan lines SL1. Each of the first scan stages SST1 may be connected to the first scan control line SCL1. Each of the first scan stages SST1 may generate a scan signal in response to a scan control signal from the first scan control line SCL1 and may output the scan signal to the first scan line SL1. The first scan stages SST1 of the first scan driver circuit SDC1 may be substantially to the same as those described above with reference to FIG. 7.

Each of the second scan stages SST2 may be connected to second scan lines SL2 connected to the pixels PX of the protruding display area PDA. The scan lines SL connected to the second scan stages SST2 may be defined as second scan lines SL2. Each of the second scan stages SST2 may be connected to the second scan control line SCL2. Each of the second scan stages SST2 may generate a scan signal in response to a scan control signal from the second scan control line SCL2 and may output the scan signal to the second scan line SL2. The second scan stages SST2 of the second scan driver circuit SDC2 may be substantially to the same as those described above with reference to FIG. 7.

In an embodiment, the first scan lines SL1 connected to the first scan stages SST1 may be connected to the pixels PX of the first corner display area CDA1 in the shortest path. In such an embodiment, the second scan lines SL2 connected to the second scan stages SST2 may be extended to the first corner non-display area CNA1 along the edge of the display panel 100 and then may be bent and connected to the pixels PX of the protruding display area PDA. Accordingly, the length of the second scan lines SL2 may be larger than the length of the first scan lines SL1. In an embodiment, the second scan lines SL2 may be bent more times than the first scan lines SL1.

Since the first scan control line SCL1 and the second scan control line SCL2 branch off from the scan control line SCL and then combined or merged back into the scan control line SCL, the first scan stages SST1 and the second scan stages SST2 may have substantially the same scan control signal applied to the first scan control line SCL1 and the second scan control line SCL2.

In the display areas FDA, SDA1, SDA4, CDA1 and PDA, scan signals may be sequentially applied from the scan lines SL disposed on the lower side to the scan lines SL disposed on the upper side. In such an embodiment, in the first circuit area CCA1, the first scan lines SL1 connected to the first scan stages SST1 are disposed lower than the second scan lines SL2 connected to the second scan stages SST2. Accordingly, the first scan stages SST1 may output the scan signals to the first scan lines SL1, and then the second scan stages SST2 may output the scan signals to the second scan lines SL2. In the second circuit area CCA2, the first scan lines SL1 connected to the first scan stages SST1 are disposed above the second scan lines SL2 connected to the second scan stages SST2. After the second scan stages SST2 output scan signals to the second scan lines SL2, the first scan stages SST1 may output scan signals to the first scan lines SL1.

Each of the first emission stages EST1 may be connected to first emission lines EL1 connected to the pixels PX of the first side display area SDA1 and the second side display area SDA2. The scan lines SL connected to the first scan stages SST1 may be defined as first scan lines SL1. The emission lines EL connected to the first emission stages EST1 may be defined as first emission lines EL1. Each of the first emission lines EL1 may be connected to the first emission stage EST1 via the first scan stage SST1.

Each of the second emission stages EST2 may be connected to second emission lines EL2 connected to the pixels PX of the protruding display area PDA. The emission lines EL connected to the second emission stages EST2 may be defined as second emission lines EL2. Each of the second emission lines EL2 may be connected to the second emission stage EST2 via the second scan stage SST2.

In an embodiment, each of the first emission stages EST1 and the second emission stages EST2 may be connected to the emission control line ECL. In such an embodiment, the first emission stages EST1 and the second emission stages EST2 may share the emission control line ECL. Each of the first emission stages EST1 and the second emission stages EST2 may generate an emission signal in response to the emission control signal from the emission control line ECL to output the emission signal to the emission line EL. Each of the first emission stages EST1 of the first emission driver circuit EDC1 and the second emission stages EST2 of the second emission driver circuit EDC2 may be substantially identical to those described above with reference to FIG. 8.

In an embodiment, the first emission lines EL1 connected to the first emission stages EST1 may be connected to the pixels PX of the first corner display area CDA1 in the shortest path. In such an embodiment, the second emission lines EL2 connected to the second emission stages EST2 may be extended to the first corner non-display area NDA1 along the edge of the display panel 100 and then may be bent and connected to the pixels PX of the protruding display area PDA. Accordingly, the length of the second emission lines EL2 may be larger than the length of the first emission lines EL'. In an embodiment, the second emission lines EL2 may be bent more times than the first emission lines EL1.

In the display areas FDA, SDA1, SDA4, CDA1 and PDA, emission signals may be sequentially applied from the emission lines EL disposed on the lower side to the emission lines EL disposed on the upper side. In such an embodiment, in the first circuit area CCA1, the emission lines EL connected to the first emission stages EST1 are disposed lower than the emission lines EL connected to the second emission stages EST2. Accordingly, the first emission stages EST1 may output the emission signals to the emission lines EL, and then the second emission stages EST2 may output the emission signals to the emission lines EL. In the second circuit area CCA2, the emission lines EL connected to the first emission stages EST1 are disposed higher than the emission lines EL connected to the second emission stages EST2. Accordingly, the second emission stages EST2 may output the emission signals to the emission lines EL, and then the first emission stages EST1 may output the emission signals to the emission lines EL.

In the first corner non-display area CNA1, the scan lines SL connected to the second scan stages SST2, the emission lines EL connected to the second emission stages EST2, the scan control line SCL, and the emission control line ECL may be disposed. Since the scan driver circuit SDC and the emission driver circuit EDC are not disposed in the first corner non-display area CNA1, the width of the first corner non-display area CNA1 may be greatly reduced.

Figure 9C:
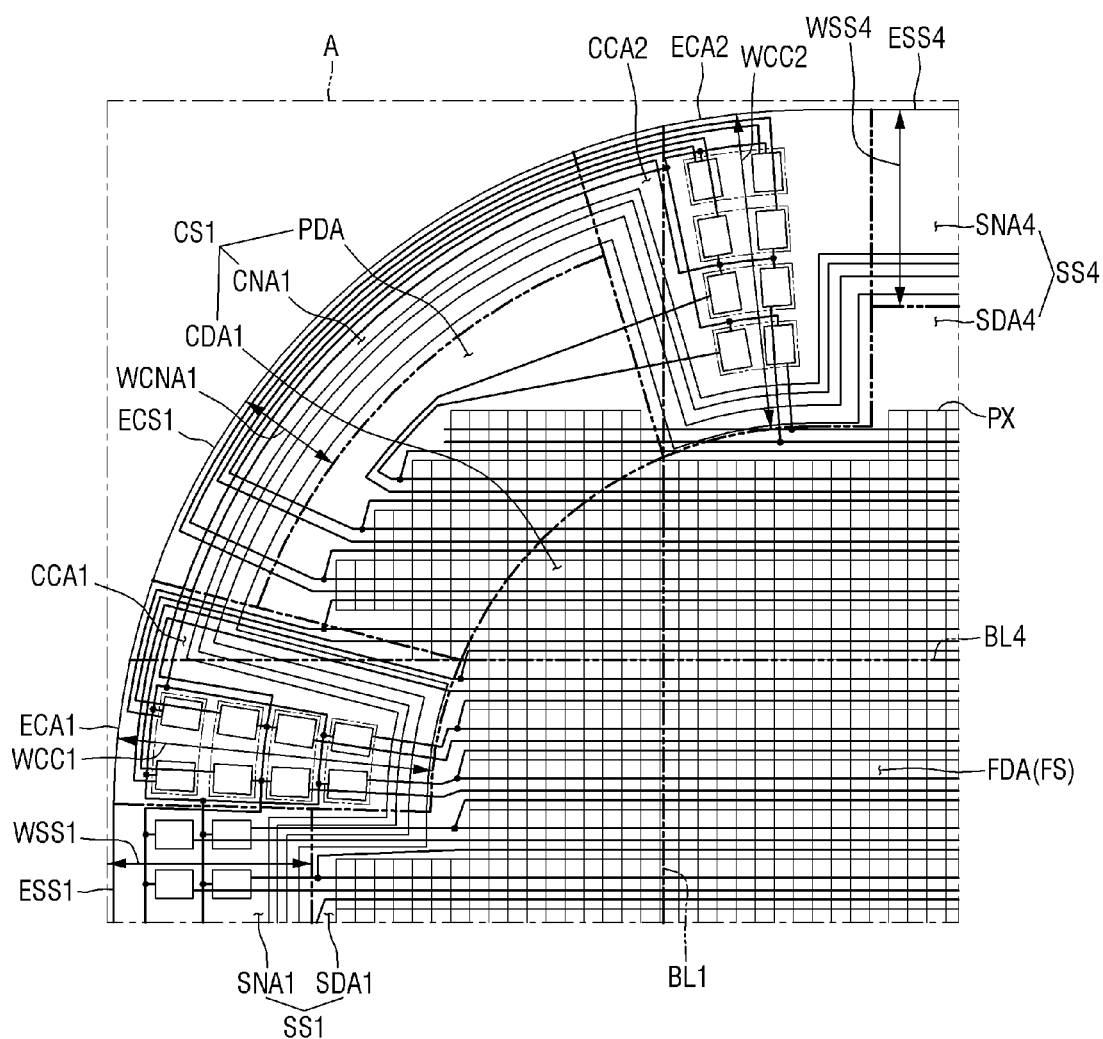
FIG. 9C is a view showing the width of the first corner non-display area, the width of the first side surface, the width of the fourth side surface, the width of the first circuit area, and the width of the second circuit area of FIG. 9A.

FIG. 9C is a view showing the width of the first corner non-display area, the width of the first side surface, the width of the fourth side surface, the width of the first circuit area, and the width of the second circuit area of FIG. 9A.

In an embodiment, as shown in FIG. 9C, the width WCNA1 of the first corner non-display area CNA1 may be smaller than the width WSS1 of the first side surface SS1, the width WSS4 of the fourth side surface SS4, the width WCC1 of the first circuit area CCA1 and the width WCC2 of the second circuit area CCA2. In such an embodiment, the width WCC1 of the first circuit area CCA1 may be greater than the width WSS1 of the first side surface SS1, and the width WCC2 of the second circuit area CCA2 may be greater than the width WSS2 of the second side surface SS2.

The width WCNA1 of the first corner non-display area CNA1 may be defined as the minimum distance between the edge ECS1 of the first corner CS1 and the protruding display area PDA. The width WSS1 of the first side surface SS1 may be defined as the minimum distance between the edge ESS1 of the first side surface SS1 and the first side display area SDA1. The width WSS4 of the fourth side surface SS4 may be defined as the minimum distance between the edge ESS4 of the fourth side surface SS4 and the fourth side display area SDA4. The width WCC1 of the first circuit area CCA1 may be defined as the distance between the edge ECA1 of the first circuit area CCA1 and the first side display area SDA1 in a direction perpendicular to the edge ECA1 of the first circuit area CCA1. The width WCC2 of the second circuit area CCA2 may be defined as the distance between the edge ECA2 of the second circuit area CCA2 and the fourth side display area SDA4 in a direction perpendicular to the edge ECA2 of the second circuit area CCA2. The width WCC4 of the fourth circuit area CCA4 may be defined as the minimum distance between the edge ECA4 of the fourth circuit area CCA4 and the fourth side display area SDA4.

The first supply voltage line VDDL and the second supply voltage line VIL may be disposed between the first corner non-display area CNA1 and the first corner display area CDA1, and between the first corner non-display area CNA1 and the protruding display area PDA. Each of the first supply voltage line VDDL and the second supply voltage line VIL may intersect the scan lines SL and the emission lines EL.

The width WCC1 of the first circuit area CCA1, the width WSS1 of the first side non-display area SNA1, and the width WCNA1 of the first corner non-display area CNA1 are different from each other, and the width WCC2 of the second circuit area CCA2, the width WSS4 of the fourth side non-display area SNA4 and the width WCNA1 of the first corner non-display area CNA1 are different from each other. Therefore, each of the first supply voltage line VDDL and the second supply voltage line VIL disposed between the display areas SDA1, SDA4 and PDA and the non-display areas SNA1, CCA1, CNA1, CCA2 and SNA4 may be bent several times.

The pixels PX for displaying images may be disposed in the first corner display area SDA1 and the protruding display area PDA. The pixels PX may be arranged in a matrix form in the first direction (X-axis direction) and the second direction (Y-axis direction). The pixels PX may be substantially to the same as those described above with reference to FIG. 6; and, therefore, any repetitive detailed description thereof will be omitted.

The protruding display area PDA may protrude from the first corner display area SD1. A bay area may be defined by the first circuit area CCA1, the second circuit area CCA2, and the first corner non-display area CNA1. The protrusion display area PDA may be surrounded by the bay area.

In an embodiment, as shown in FIGS. 9A and 9B, the scan driver circuit SDC does not include the dummy scan stages DST, and the emission driver circuit EDC does not include the dummy emission stages DET. In such an embodiment, some of the scan stages SST and the emission stages DET are disposed in the first circuit area CCA1 between the first side non-display area SNA1 and the first corner non-display area CNA1. In such an embodiment, the others of the scan stages SST and the emission stages DET are disposed in the second circuit area CCA2 between the fourth side non-display area SNA4 and the first corner non-display area CNA1.

In an embodiment, the dummy scan stages DST and the dummy emission stages DET are not provided, and the scan stages SST and the emission stages DST are disposed in the first and second circuit areas CCA1 and CCA2, such that the area of the first corner non-display area CNA1 may be reduced. In such an embodiment, the first corner non-display area CNA1 is reduced, and the protruding display area PDA is disposed or provided, such that the display area of the first corner CS1 may be increased.

Figure 10:
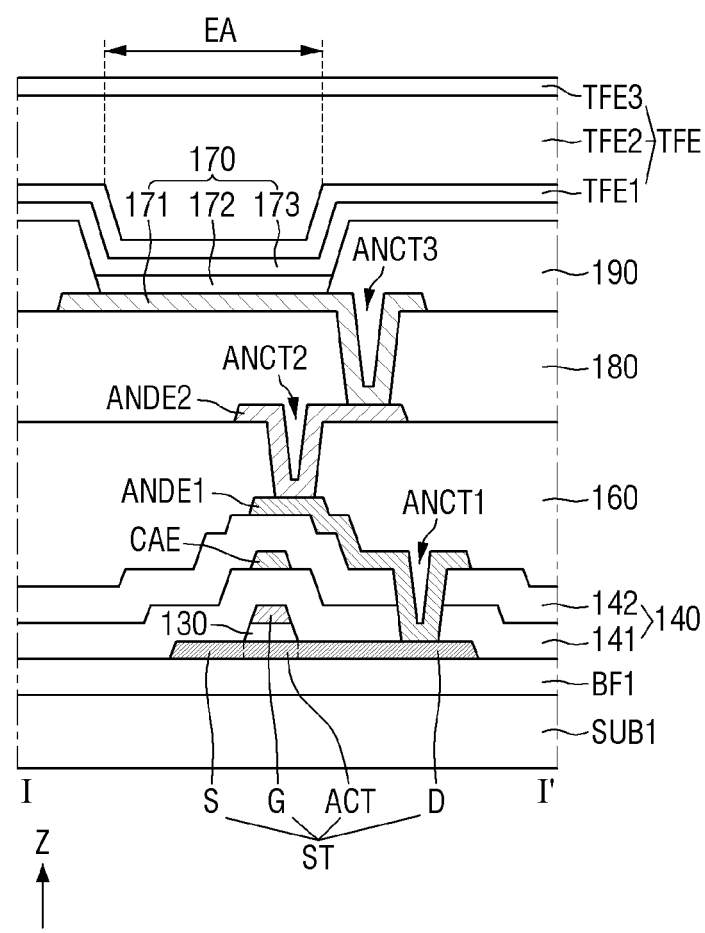
FIG. 10 is a cross-sectional view showing an embodiment of a display panel taken along line I-I' of FIG. 9B.
Figure 11:
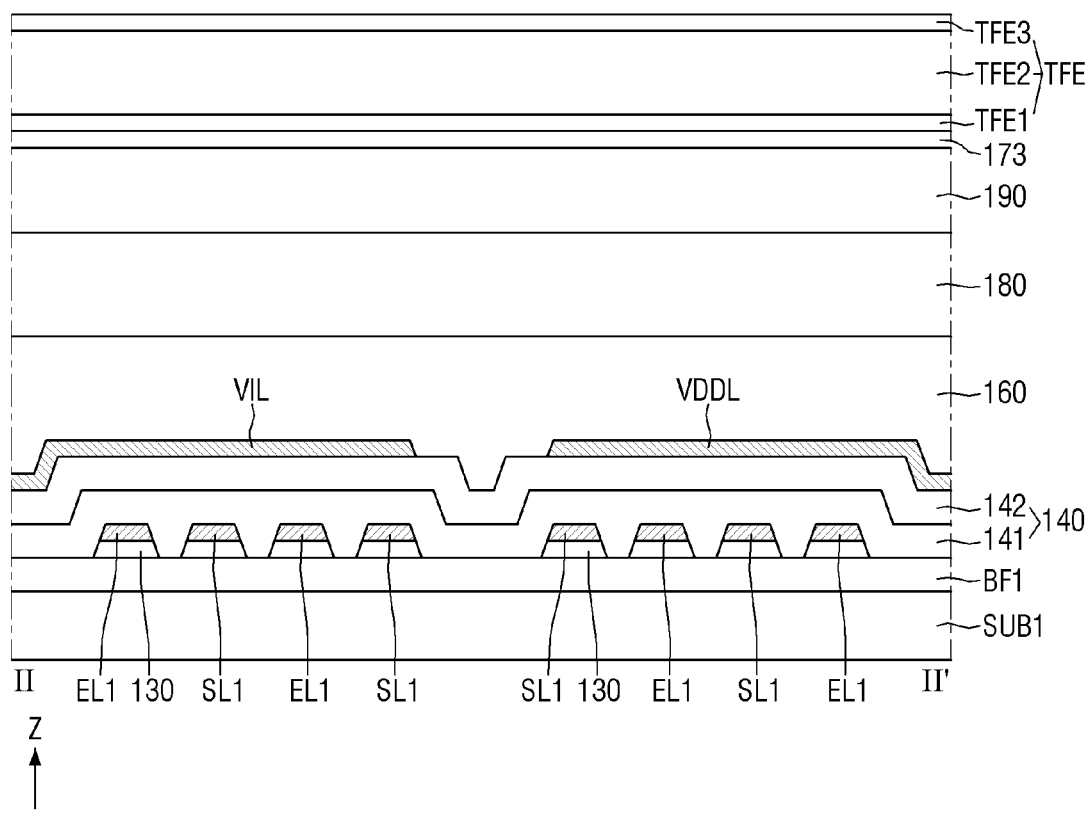
FIG. 11 is a cross-sectional view showing an embodiment of a display panel taken along line II-II' of FIG. 9B.
Figure 12:
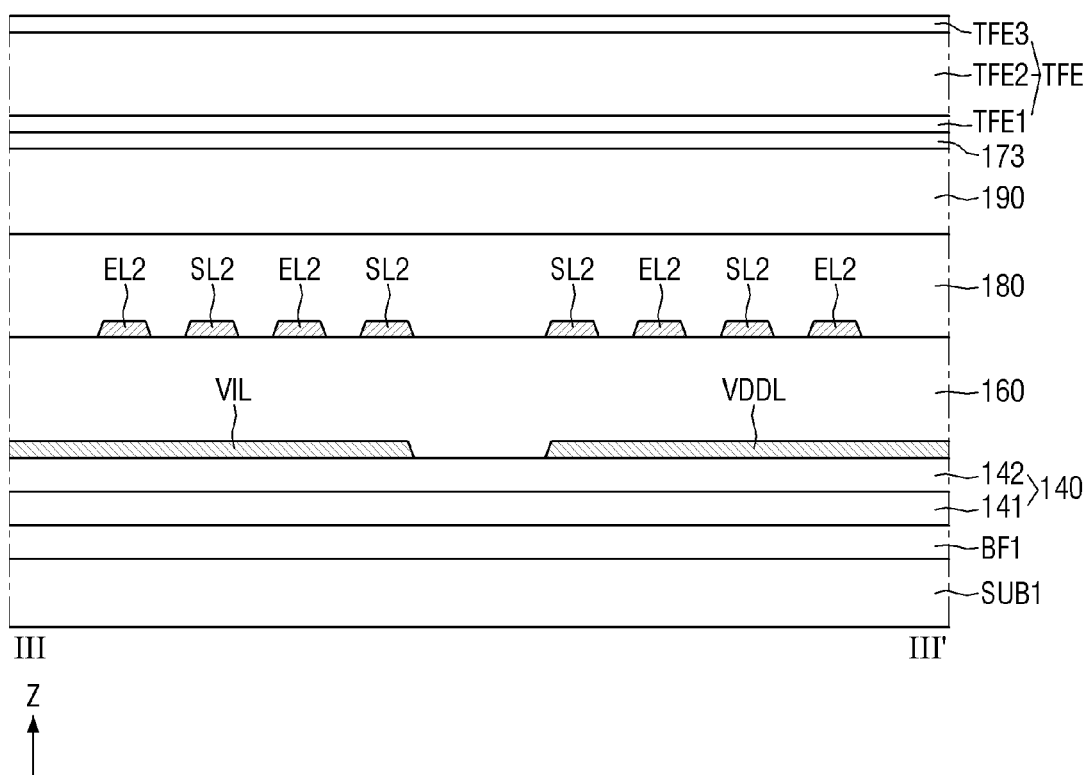
FIG. 12 is a cross-sectional view showing an embodiment of a display panel taken along line III-III' of FIG. 9B.

FIG. 10 is a cross-sectional view showing an embodiment of a display panel taken along line I-I' of FIG. 9B. FIG. 11 is a cross-sectional view showing an embodiment of a display panel taken along line II-II' of FIG. 9B. FIG. 12 is a cross-sectional view showing an embodiment of a display panel taken along line III-III' of FIG. 9B.

A cross section of a portion of the display panel including a pixel PX is shown in FIG. 10. The cross section of a portion of the display panel including the scan lines SL and the emission lines EL intersecting the first supply voltage line VDDL and the second supply voltage line VIL is shown in each of FIGS. 11 and 12.

Referring to FIGS. 10 to 12, first buffer layers BF1 may be disposed on a first substrate SUB1.

The first substrate SUB1 may include or be made of an insulating material such as a polymer resin. In one embodiment, for example, the first substrate SUB1 may include polyimide ("PI"). The first substrate SUB1 may be a flexible substrate that may be bent, folded, or rolled.

The first buffer layers BF1 is a layer for protecting the thin-film transistors of a thin-film transistor layer TFTL and an emissive layer 172 of the emission material layer EML. Each of the first buffer layers BF1 may be made up of multiple inorganic layers sequentially stacked on one another. In one embodiment, for example, each of the first buffer layers BF1 may be defined by or made up of multiple layers in which one or more inorganic layers, each layer including at least one selected from a silicon nitride layer, a silicon oxynitride layer, a silicon oxide layer, a titanium oxide layer and an aluminum oxide layer, are alternately stacked on one another.

In an embodiment, a second substrate (not shown) may be disposed on the first buffer layers BF1, and a second buffer layer (not shown) may be further disposed on the second substrate. In an embodiment, a light-blocking layer (not shown) for blocking light incident on the first substrate SUB1 may be disposed on the first substrate SUB1.

An active layer ACT of a thin-film transistor ST may be disposed on the first buffer layer BF1. The active layer ACT of the thin film transistor ST includes polycrystalline silicon, single crystal silicon, low-temperature polycrystalline silicon, amorphous silicon, or an oxide semiconductor. In an embodiment, the active layer ACT of the thin-film transistor ST exposed without being covered by the gate insulating layer 130 may be doped with impurities or ions to have conductivity. Therefore, the source electrode S and the drain electrode D of the thin film transistor ST having conductivity may be provided or defined by the portions of the active layer ACT doped with impurities.

The gate insulating layer 130 may be disposed on the active layer ACT of the thin-film transistor ST. The gate insulating layer 130 may include or be formed of an inorganic layer, for example, a silicon nitride layer, a silicon oxynitride layer, a silicon oxide layer, a titanium oxide layer, or an aluminum oxide layer.

The gate electrode G of the thin-film transistor ST and the first scan lines SL1 may be disposed on the gate insulating layer 130. The gate electrode G of the thin-film transistor ST may overlap the active layer ACT in the third direction (Z-axis direction). The gate electrode G and the first scan lines SL1 of the thin-film transistor ST may be defined by or made up of a single layer or multiple layers, each layer including at least one selected from molybdenum (Mo), aluminum (Al), chromium (Cr), gold (Au), titanium (Ti), nickel (Ni), neodymium (Nd) and copper (Cu).

A first interlayer dielectric layer 141 may be disposed on the gate electrode G and the first scan lines SL1 of the thin-film transistor ST. The first interlayer dielectric layer 141 may include or be formed of an inorganic layer, for example, a silicon nitride layer, a silicon oxynitride layer, a silicon oxide layer, a titanium oxide layer, or an aluminum oxide layer. The first interlayer dielectric layer 141 may have a multilayer structure including a plurality of inorganic layers stacked on one another.

A capacitor electrode CAE may be disposed on the first interlayer dielectric layer 141. The capacitor electrode CAE may overlap the gate electrode G of the third thin-film transistor ST in the third direction (Z-axis direction). Since the first interlayer dielectric layer 141 has a predetermined dielectric constant, a capacitor may be formed by the capacitor electrode CAE, the gate electrode G, and the first interlayer dielectric layer 141 disposed between them. The capacitor electrode CAE may be made up of a single layer or multiple layers, each layer including at least one selected from molybdenum (Mo), aluminum (Al), chromium (Cr), gold (Au), titanium (Ti), nickel (Ni), neodymium (Nd) and copper (Cu).

A second interlayer dielectric layer 142 may be disposed over the capacitor electrode CAE. The second interlayer dielectric layer 142 may include or be formed of an inorganic layer, for example, a silicon nitride layer, a silicon oxynitride layer, a silicon oxide layer, a titanium oxide layer, or an aluminum oxide layer. The second interlayer dielectric layer 142 may have a multilayer structure including a plurality of inorganic layers stacked on one another. The first and second interlayer dielectric layers 141 and 142 may be collectively referred to as an interlayer dielectric layer 140.

In an embodiment, as shown in FIGS. 10 and 11, a first anode connection electrode ANDE1, a first supply voltage line VDDL, and a second supply voltage line VIL may be disposed on the second interlayer dielectric layer 142. The first anode connection electrode ANDE1 may be connected to the drain electrode D of the thin-film transistor ST through a first anode contact hole ANCT1 that is defined through the first interlayer dielectric layer 141 and the second interlayer dielectric layer 142 to expose the drain electrode D of the thin-film transistor ST. The first anode connection electrode ANDE1, the first supply voltage VDDL and the second supply voltage line VIL may be defined by or made up of a single layer or multiple layers, each layer including at least one selected from molybdenum (Mo), aluminum (Al), chromium (Cr), gold (Au), titanium (Ti), nickel (Ni), neodymium (Nd) and copper (Cu).

A first organic layer 160 may be disposed over the first anode connection electrode ANDE1, the first supply voltage line VDDL and the second supply voltage line VIL for providing a flat surface. The first organic layer 160 may include or be formed as an organic layer including an organic material such as an acryl resin, an epoxy resin, a phenolic resin, a polyamide resin and a PI resin.

A second anode connection electrode ANDE2 and second scan lines SL2 may be disposed on the first organic layer 160. The second anode connection electrode ANDE2 may be connected to the second anode connection electrode ANDE2 through a second anode contact hole ANCT2 that is defined through the first organic layer 160 to expose the first anode connection electrode ANDE1. The second scan lines SL2 are disposed on the first organic layer 160 in the first corner non-display area CNA1. In an embodiment, as shown in FIG. 12, the second scan lines SL2 may be disposed on the gate insulating layer 130 in the protruding display area PDA together with the first scan lines SL1. The second anode connection electrode ANDE2 and the second scan lines SL2 may be defined by or made up of a single layer or multiple layers, each layer including at least one selected from molybdenum (Mo), aluminum (Al), chromium (Cr), gold (Au), titanium (Ti), nickel (Ni), neodymium (Nd) and copper (Cu).

The second organic layer 180 may be disposed on the second anode connection electrode ANDE2. The second organic layer 180 may be an organic layer including an organic material such as an acryl resin, an epoxy resin, a phenolic resin, a polyamide resin and a PI resin.

The thin-film transistor ST shown in FIG. 10 may be an embodiment of the sixth transistor ST6 of FIG. 6. In FIG. 10, the thin-film transistor ST is implemented as a top-gate transistor in which the gate electrode G is located above the active layer ACT. It is, however, to be understood that the disclosure is not limited thereto. Alternatively, the thin-film transistor ST may be implemented as a bottom-gate transistor in which the gate electrode G is located below the active layer ACT, or as a double-gate transistor in which the gate electrodes G are disposed above and below the active layer ACT.

Light-emitting elements 170 and a bank 190 may be disposed on the second organic layer 180. Each of the light-emitting elements 170 may include a first light-emitting electrode 171, an emissive layer 172, and a second light-emitting electrode 173.

The first light-emitting electrode 171 may be disposed on the second organic layer 180. The first light-emitting electrode 171 may be connected to the second anode connection electrode ANDE2 through a third anode contact hole ANCT3 that is defined through the second organic layer 180 to expose the second anode connection electrode ANDE2.

In an embodiment where the light-emitting element 170 is a top-emission organic light-emitting diode that light exits from the emissive layer 172 toward the second light-emitting electrode 173, the first light-emitting electrode 171 may include or be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and copper (Cu).

The bank 190 may partition the first light-emitting electrode 171 on the second organic layer 180 to serve to define an emission area EA. The bank 190 may be disposed to cover the edge of the first light-emitting electrode 171. The bank 190 may be an organic layer including an organic material such as an acryl resin, an epoxy resin, a phenolic resin, a polyamide resin and a PI resin.

In the emission area EA, the first light-emitting electrode 171, the emissive layer 172 and the second light-emitting electrode 173 are stacked on one another sequentially, so that holes from the first light-emitting electrode 171 and electrons from the second light-emitting electrode 173 are combined with each other in the emissive layer 172 to emit light.

The emissive layer 172 is disposed on the first light-emitting electrode 171 and the bank 190. The emissive layer 172 may include an organic material and emit light of a certain color. In one embodiment, for example, the emissive layer 172 may include a hole transporting layer, an organic material layer, and an electron transporting layer.

The second light-emitting electrode 173 is disposed on the emissive layer 172. The second light-emitting electrode 173 may be disposed to cover the emissive layer 172. The second light-emitting electrode 173 may be a common layer formed across all of the emission areas EA. A capping layer may be disposed on the second light-emitting electrode 173.

In an embodiment where the light-emitting element 170 is the top-emission organic light-emitting diode, the second light-emitting electrode 173 may be formed of a transparent conductive material ("TCP") such as indium tin oxide ("ITO") and indium zinc oxide ("IZO") that may transmit light, or a semi-transmissive conductive material such as magnesium (Mg), silver (Ag) and an alloy of magnesium (Mg) and silver (Ag). In an embodiment where the second light-emitting electrode 173 includes or is formed of a semi-transmissive conductive material, the light extraction efficiency may be increased by using microcavity effects.

An encapsulation layer TFE may be disposed on the second light-emitting electrode 173. In an embodiment, the encapsulation layer TFE includes at least one inorganic layer to prevent permeation of oxygen or moisture into the light-emitting element layer EML. In such an embodiment, the encapsulation layer TFE may further include at least one organic layer to protect the light-emitting element layer EML from foreign substances such as dust. In one embodiment, for example, the encapsulation layer TFE includes a first inorganic layer TFE1, an organic layer TFE2 and a second inorganic layer TFE3.

The first inorganic layer TFE1 may be disposed on the second light-emitting electrode 173, the organic layer TFE2 may be disposed on the first inorganic layer TFE1, and the second inorganic layer TFE3 may be disposed on the organic layer TFE2. The first inorganic layer TFE1 and the second inorganic layer TFE3 may be defined by or made up of multiple layers in which one or more inorganic layers such as a silicon nitride layer, a silicon oxynitride layer, a silicon oxide layer, a titanium oxide layer and an aluminum oxide layer are alternately stacked on one another. The organic layer TFE2 may include a monomer.

Although FIGS. 10 to 12 illustrate an embodiment where the second scan lines SL2 and the second light-emitting lines EL2 are disposed on the first organic layer 160, the disclosure is not limited thereto. Alternatively, the second scan lines SL2 and the second light-emitting lines EL2 may be disposed in a same layer as the capacitor electrode CAE. In one embodiment, for example, the second scan lines SL2 and the second light-emitting lines EL2 may be disposed on the first interlayer dielectric layer 141. Alternatively, the second scan lines SL2 and the second light-emitting lines EL2 may be disposed on the same layer as the first scan lines SL1 and the first light-emitting lines EL1. In one embodiment, for example, the second scan lines SL2 and the second light-emitting lines EL2 may be disposed on the gate insulating layer 130. Alternatively, the second scan lines SL2 and the second light-emitting lines EL2 may be disposed in a same layer as the first anode connection electrode ANDE1. In one embodiment, for example, the second scan lines SL2 and the second light-emitting lines EL2 may be disposed on the second interlayer dielectric layer 142.

Although FIGS. 10 to 12 illustrate an embodiment where the first scan lines SL1 and the first light-emitting lines EL1 are disposed on the gate insulating layer 130, the disclosure is not limited thereto. Alternatively, the first scan lines SL1 and the first light-emitting lines EL1 may be disposed on the first interlayer dielectric layer 141. Alternatively, the first scan lines SL1 and the first light-emitting lines EL1 may be disposed on the second interlayer dielectric layer 142. Alternatively, the first scan lines SL1 and the first light-emitting lines EL1 may be disposed on the first organic layer 160.

Figure 13A:
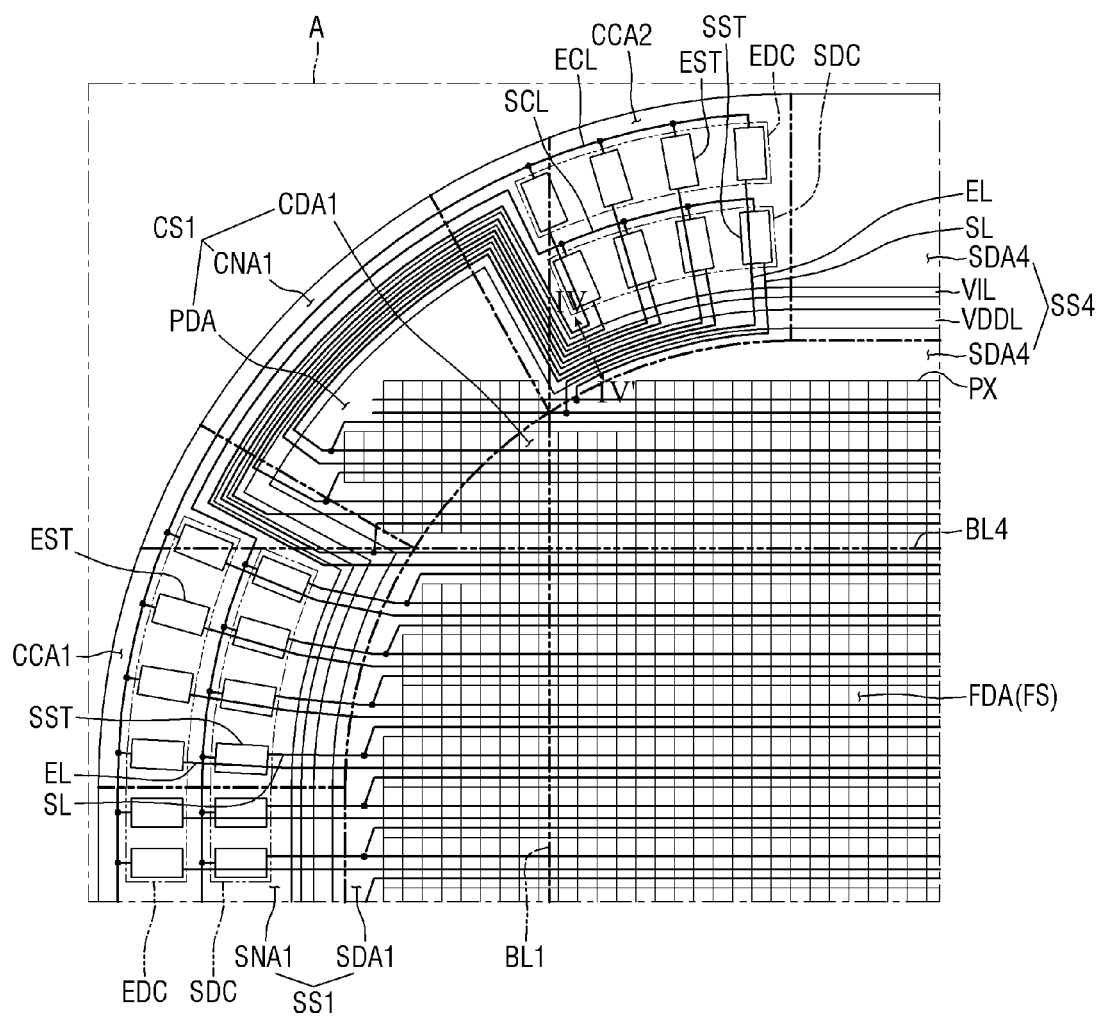
FIG. 13A is a view showing a layout of a first corner according to an alternative embodiment.

FIG. 13A is a view showing a layout of a first corner according to an alternative embodiment.

According to an embodiment, as shown in FIG. 13A, a first circuit area CCA1 is disposed between a first side non-display area SNA1 and a first corner non-display area CNA1, a second circuit area CCA2 is disposed between a fourth side non-display area SNA4 and a first corner non-display area CNA1, and a protruding display area PDA is disposed where the first corner non-display area CNA1 is reduced, as in the embodiment described above with reference to FIGS. 9A and 9B. However, such an embodiment of FIG. 13A is different from the embodiment of FIGS. 9A and 9B in that each of the first circuit area CCA1 and the second circuit area CCA2 has one scan driver circuit SDC and one emission driver circuit EDC, and that the scan lines SL of the second circuit area CCA2 are extended along the first supply voltage line VDDL and the second supply voltage line VIL and are connected to the pixels PX of the protruding display area PDA. For convenience of description, any repetitive detailed description of the same or like elements of the embodiment of FIG. 13A as those of the embodiment of FIGS. 9A and 9B will hereinafter be omitted or simplified.

Referring to FIG. 13A, the first circuit area CCA1 and the second circuit area CCA2 include a scan driver circuit SDC and an emission driver circuit EDC.

The scan driver circuit SDC1 may be disposed closer to the first corner display area CDA1 and the protruding display area PDA than the emission driver circuit EDC is. In such an embodiment, the emission driver circuit EDC may be disposed farther from the first corner display area CDA1 and the protruding display area PDA than the scan driver circuit SDC is.

The scan control line SCL may be disposed between the scan driver circuit SDC and the emission driver circuit EDC. The emission control line ECL may be disposed between the emission driver circuit EDC and the edge of the display panel 100.

The scan driver circuit SDC includes scan stages SST. The scan stages SST of the first circuit area CCA1 may be connected to the scan lines SL connected to the pixels PX of the first side display area SDA1. The scan stages SST of the second circuit area CCA2 may be connected to the scan lines SL connected to the pixels PX of the second side display area SDA2 and the protruding display area PDA.

The scan lines SL connected to the scan stages SST of the first circuit area CCA1 may be connected to the pixels PX of the first side display area SDA1 in the shortest path. In such an embodiment, the scan lines SL connected to the scan stages SST of the second circuit area CCA2 may be extended along the first supply voltage line VDDL and the second supply voltage line VIL and then may be connected to the pixels PX of the second side display area SDA2 and the protruding display area PDA.

The pixels PX disposed in the second side display area SDA2 are defined as the first pixels, and the pixels PX disposed in the protruding display area PDA are defined as the second pixels. In addition, the scan lines SL connected to the first pixels are defined as the first scan lines SL1, and the scan lines SL connected to the second pixels are defined as the second scan lines SL2. Although both the first scan lines SL1 and the second scan lines SL2 are extended along the first supply voltage line VDDL, the length of the second scan lines SL2 is greater than the length of the first scan lines SL1. In an embodiment, the second scan lines SL2 may be bent more times than the first scan lines SL1.

In an embodiment, the area where the second scan lines SL2 overlap the first supply voltage line VDDL may be greater than the area where the first scan lines SL1 overlap the first supply voltage line VDDL. Alternatively, both the first scan line SL1 and the second scan line SL2 are extended along the second supply voltage line VIL, and the area where the second scan line SL2 overlaps the second supply voltage line VIL may be greater than the area where the first scan line SL1 overlaps the second supply voltage line VIL because the length of the second scan line SL2 is greater than the length of the first scan line SL1.

The width of the first circuit area CCA1 is different from the width of the first corner non-display area CNA1, and the width of the second circuit area CCA2 is different from the width of the second corner non-display area CNA2. Accordingly, each of the first supply voltage line VDDL and the second supply voltage line VIL disposed between the display areas SDA1, SDA4 and PDA and the non-display areas CCA1, CNA1 and CCA2 may be bent several times. Accordingly, the scan lines SL connected to the scan stages SST of the second circuit area CCA2 may also be bent several times.

Each of the scan stages SST of the first circuit area CCA1 may generate a scan signal in response to a scan control signal from the scan control line SCL and may output the scan signal to a scan line SL connected to the pixel PX of the first side display area SDA1. Each of the scan stages SST of the second circuit area CCA2 may generate a scan signal in response to a scan control signal from the scan control line SCL and may output the scan signal to a scan line SL connected to the pixel PX of the fourth side display area SDA4 and the protruding display area PDA.

The emission driver circuit EDC includes emission stages EST. The emission stages EST of the first circuit area CCA1 may be connected to the emission lines EL connected to the pixels PX of the first side display area SDA1. The emission stages EST of the second circuit area CCA2 may be connected to the emission lines EL connected to the pixels PX of the fourth side display area SDA4 and the protruding display area PDA.

The emission lines EL connected to the emission stages EST of the first circuit area CCA1 may be connected to the pixels PX of the first side display area SDA1 in the shortest path. In such an embodiment, the emission lines EL connected to the emission stages EST of the second circuit area CCA2 may be extended along the first supply voltage line VDDL and the second supply voltage line VIL and then may be connected to the pixels PX of the fourth side display area SDA4 and the protruding display area PDA.

The emission lines EL connected to the first pixels PX1 are defined as the first emission lines EL1 and the emission lines EL connected to the second pixels PX2 are defined as the second emission lines EL2. Although both the first emission lines EL1 and the second emission lines EL2 are extended along the first supply voltage line VDDL, the length of the second emission lines EL2 is greater than the length of the first emission lines EL1. In an embodiment, the second emission lines EL2 may be bent more times than the first emission lines EL1.

Figure 13B:
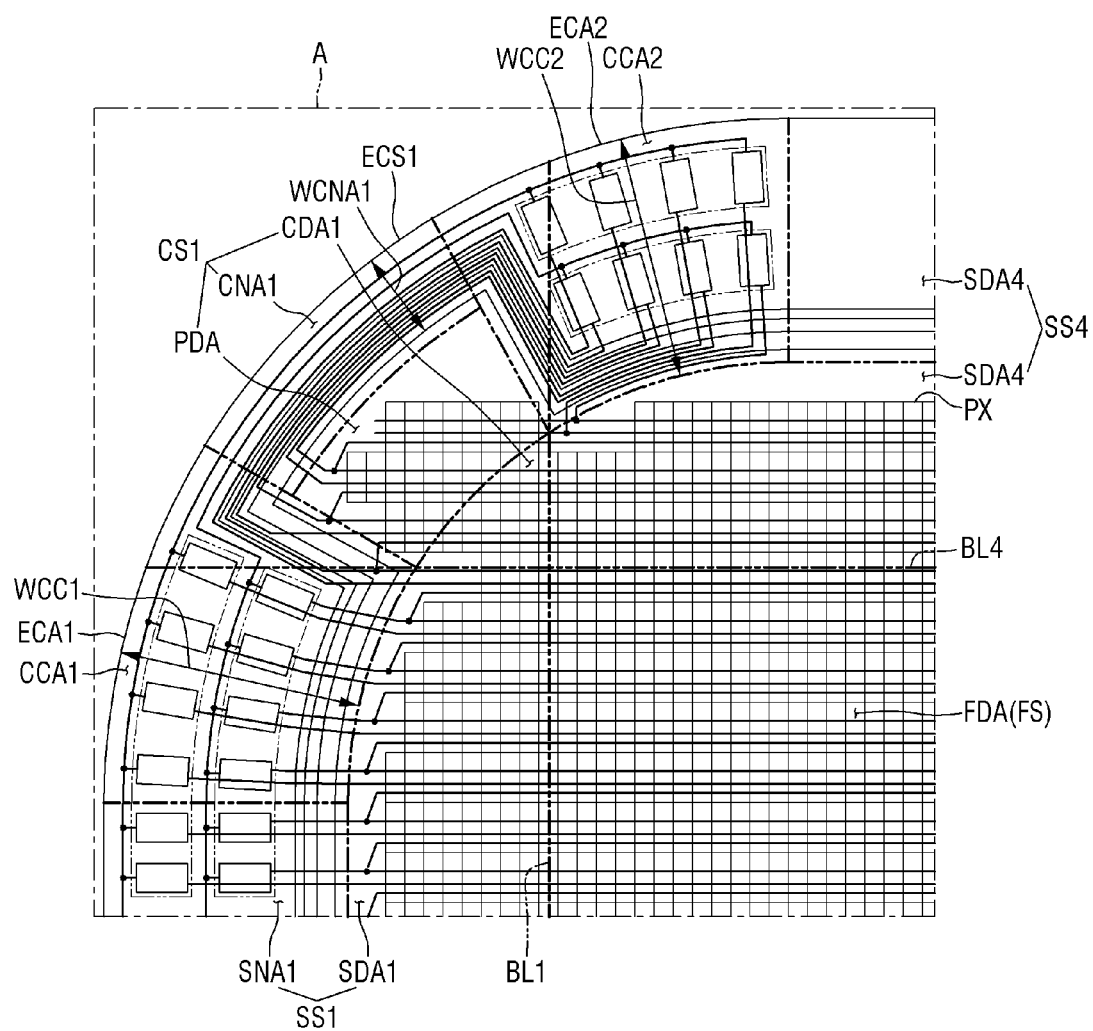
FIG. 13B is an exemplary view showing the width of the first corner non-display area, the width of the first circuit area, and the width of the second circuit area of FIG. 13A.

In an embodiment, the area where the second emission lines EL2 overlap the second supply voltage line VDDL may be greater than the area where the first emission lines EL1 overlap the first supply voltage line VDDL. Alternatively, both the first emission line EL1 and the second emission line EL2 are extended along the second supply voltage line VIL, and the area where the second emission line EL2 overlaps the second supply voltage line VIL may be greater than the area where the first emission line EL1 overlaps the second supply voltage line VIL because the length of the second emission line EL2 is larger than the length of the first emission line ELL In an embodiment, as shown in FIG. 13B, the width WCC1 of the first circuit area CCA1 is different from the width WCNA1 of the first corner non-display area CNA1, and the width WCC2 of the second circuit area CCA2 is different from the width WCNA1 of the first corner non-display area CNA1. Accordingly, each of the first supply voltage line VDDL and the second supply voltage line VIL disposed between the display areas SDA1, SDA4 and PDA and the non-display areas CCA1, CNA1 and CCA2 may be bent several times. Accordingly, the emission lines EL connected to the emission stages EST of the second circuit area CCA2 may also be bent several times.

Each of the emission stages EST of the first circuit area CCA1 may generate an emission signal in response to an emission control signal from the emission control line ECL and may output the emission signal to an emission line EL connected to the pixel PX of the first side display area SDA1. Each of the emission stages EST of the second circuit area CCA2 may generate an emission signal in response to an emission control signal from the emission control line ECL and may output the emission signal to an emission line EL connected to the pixel PX of the second side display area SDA2 and the protruding display area PDA.

In an embodiment, as shown in FIG. 13A, the scan driver circuit SDC does not include the dummy scan stages DST, and the emission driver circuit EDC does not include the dummy emission stages DET. In such an embodiment, some of the scan stages SST and the emission stages DET are disposed in the first circuit area CCA1 between the first side non-display area SNA1 and the first corner non-display area CNA1. In such an embodiment, the others of the scan stages SST and the emission stages DET are disposed in the second circuit area CCA2 between the fourth side non-display area SNA4 and the first corner non-display area CNA1.

In such an embodiment, the dummy scan stages DST and the dummy emission stages DET are eliminated, and the scan stages SST and the emission stages DST are disposed in the first and second circuit areas CCA1 and CCA2. Accordingly, the area of the first corner non-display area CNA1 may be reduced. In such an embodiment, although the first corner non-display area CNA1 is reduced, the protruding display area PDA is disposed, and thus the display area of the first corner CS1 may be increased.

Figure 14:
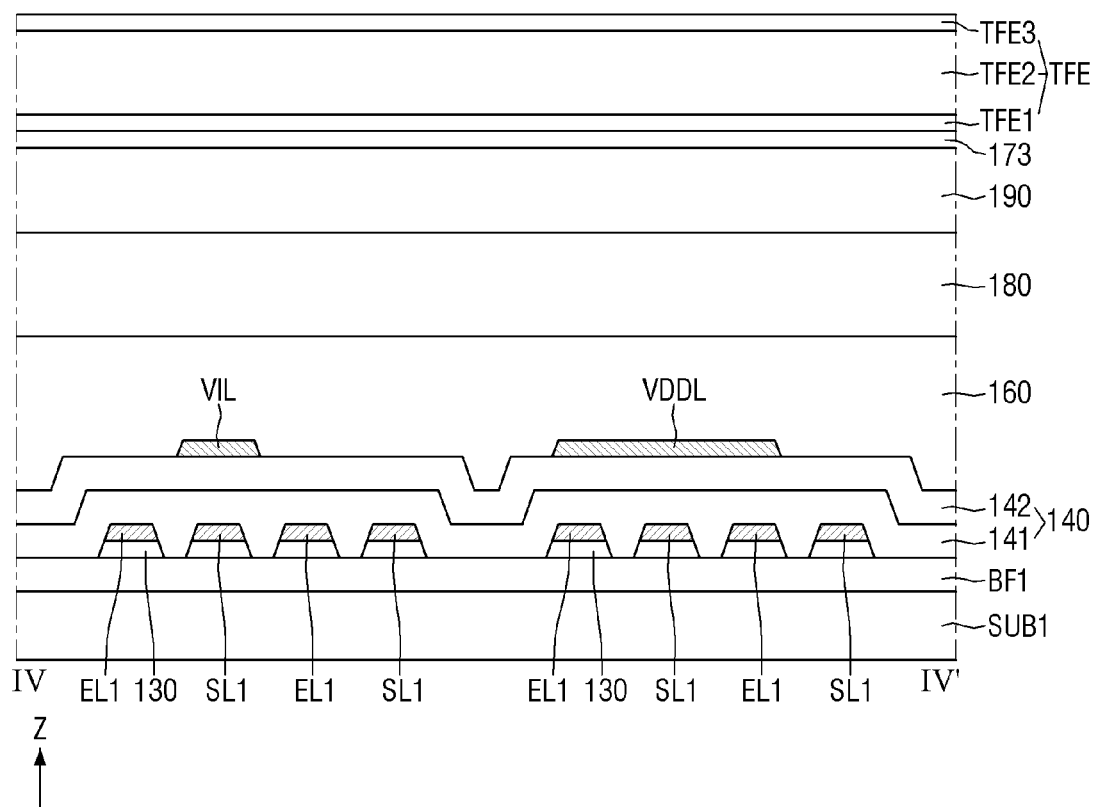
FIG. 14 is a cross-sectional view showing an example of a display panel, taken along line IV-IV' of FIG. 13A.

FIG. 14 is a cross-sectional view showing an embodiment of a display panel, taken along line IV-IV' of FIG. 13A.

The embodiment shown in FIG. 14 is substantially the same as the embodiment described above with reference to FIG. 12, except that the emission lines EL and the scan lines SL are disposed on the gate insulating layer 130. Accordingly, any repetitive detailed description of the same or like elements as those described above with reference to FIG. 12 will hereinafter be omitted.

Figure 15:
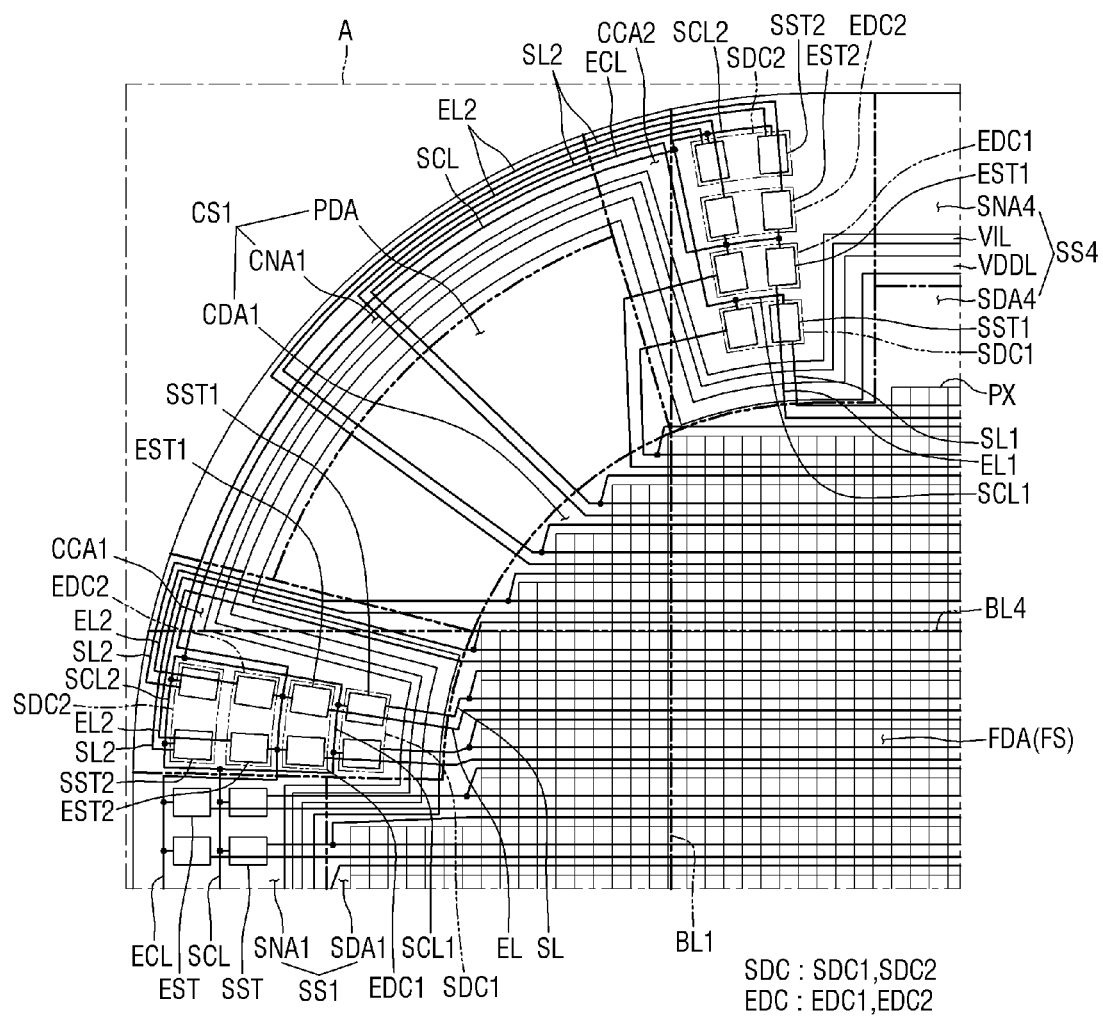
FIG. 15 is a view showing a layout of a first corner according to an alternative embodiment.

FIG. 15 is a view showing a layout of a first corner according to another alternative embodiment, where no pixel is disposed in the protruding display area.

The embodiment of FIG. 15 is substantially the same as the embodiment of FIG. 15 except that no pixel PX is disposed in the protruding display area PDA; and, therefore, any repetitive detailed description of the same or like elements as those described above with reference to FIG. 9A will be omitted.

Figure 16:
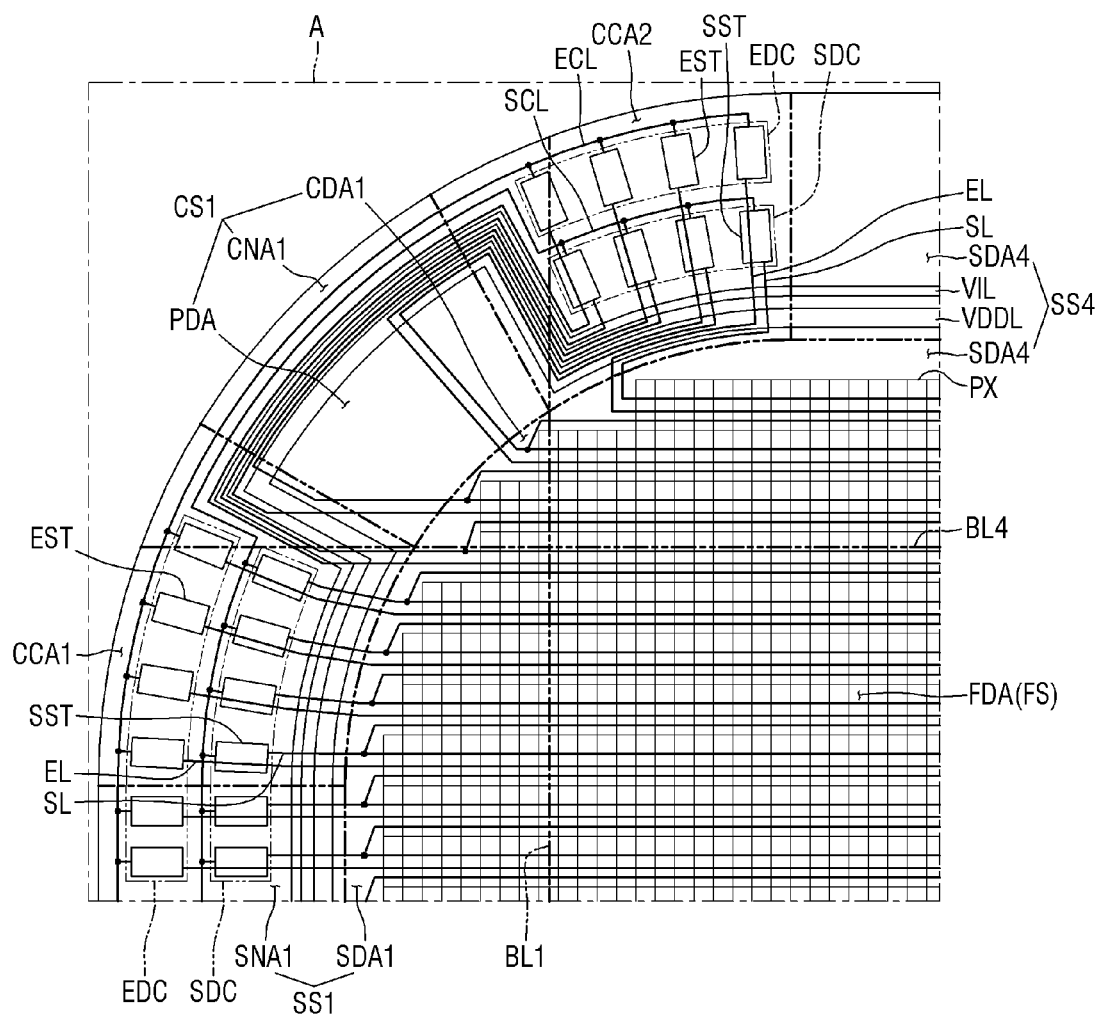
FIG. 16 is a view showing a layout of a first corner according to another alternative embodiment.

FIG. 16 is a view showing a layout of a first corner according to yet another alternative embodiment, where no pixel is disposed in the protruding display area.

The embodiment of FIG. 16 is substantially to the same as the embodiment of FIG. 13A except that no pixel PX is disposed in the protruding display area PDA; and, therefore, any repetitive detailed description of the same or like elements as those described above with reference to FIG. 13A will be omitted.

Figure 17:
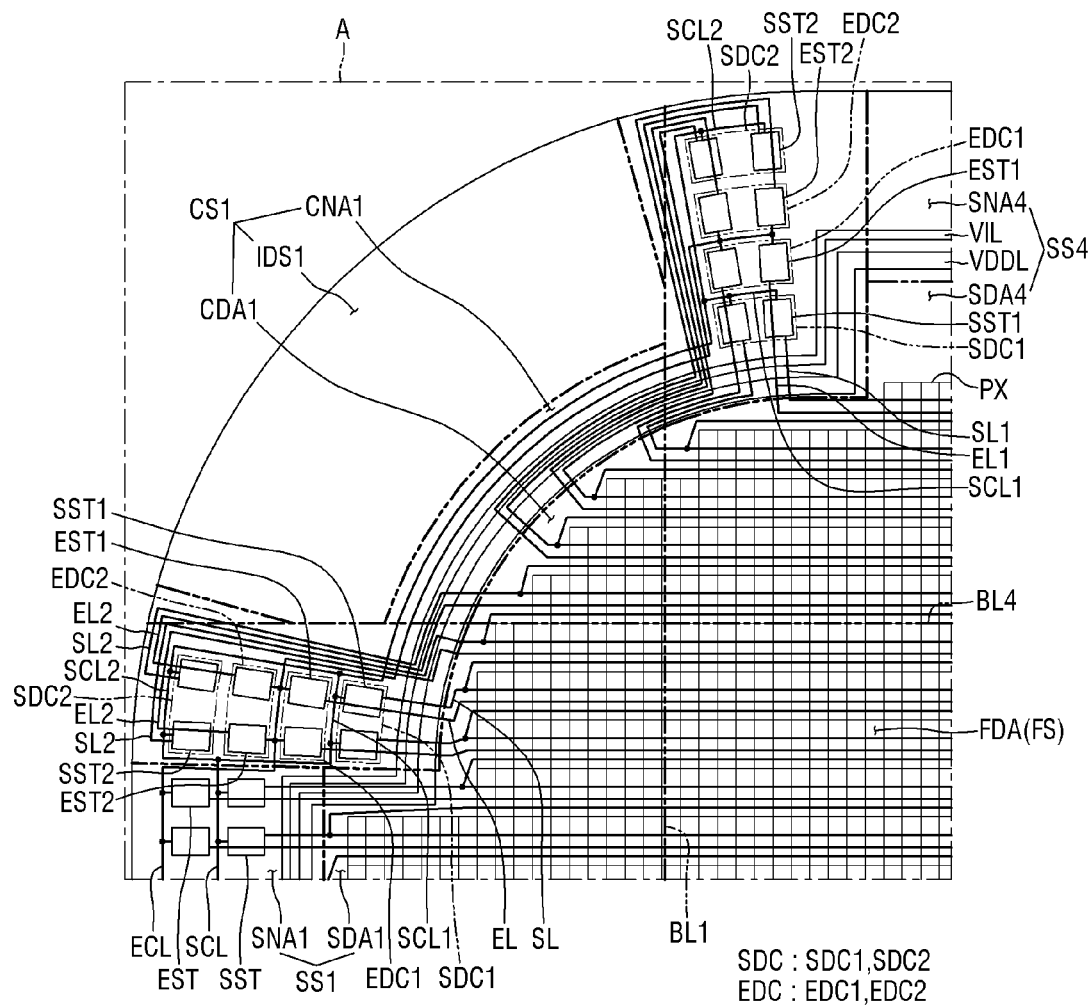
FIG. 17 is a view showing a layout of a first corner according to yet another alternative embodiment.

FIG. 17 is a view showing a layout of a first corner according to yet another alternative embodiment, where the non-display area is reduced from the first exemplary embodiment.

The embodiment of FIG. 17 is substantially the same as the embodiment of FIG. 9A except that a first corner non-display area CNA1 of a first corner CS1 is disposed adjacent to a first corner display area CDA1, and that a first corner CS1 further includes a first idle space IDS1 disposed on the outer side of the first corner non-display area CNA1. For convenience of description, any repetitive detailed description of the same or like elements as those described above with reference to FIG. 9A will hereinafter be omitted or simplified.

Referring to FIG. 17, the first corner non-display area CNA1 is disposed on the outer side of the first corner display area CDA1. The first corner non-display area CNA1 is disposed between the first corner display area CDA1 and the first idle space IDS1.

A first scan control line SCL1, a second scan control line SCL2, a first emission control line ECL1 and a second emission control line ECL2 of the first corner non-display area CNA1 may be disposed closer to the first corner display area CDA1 than to the edge of the display panel 100. In such an embodiment, the first supply voltage line VDDL and the second supply voltage line VIL may be disposed closer to the first corner display area CDA1 than to the edge of the display panel 100.

The first idle space IDS1 may be disposed on the outer side of the first corner non-display area CNA1. The first idle space IDS1 may be the edge of the first corner CS1. None of the elements of the display panel 100 may be disposed in the first idle space IDS1. In addition, the substrate of the display panel 100 may be removed from the first idle space IDS1.

In an embodiment, as shown in FIG. 17, the first corner non-display area NDA1 is reduced in the first corner CS1, so that the first idle space IDS1 is defined in the first corner CS1. Accordingly, since the light-blocking area of the cover window disposed on the display panel 100 may not cover the first idle space IDS1, the non-display area of the first corner CS1 recognized by the user may be reduced.

Figure 18:
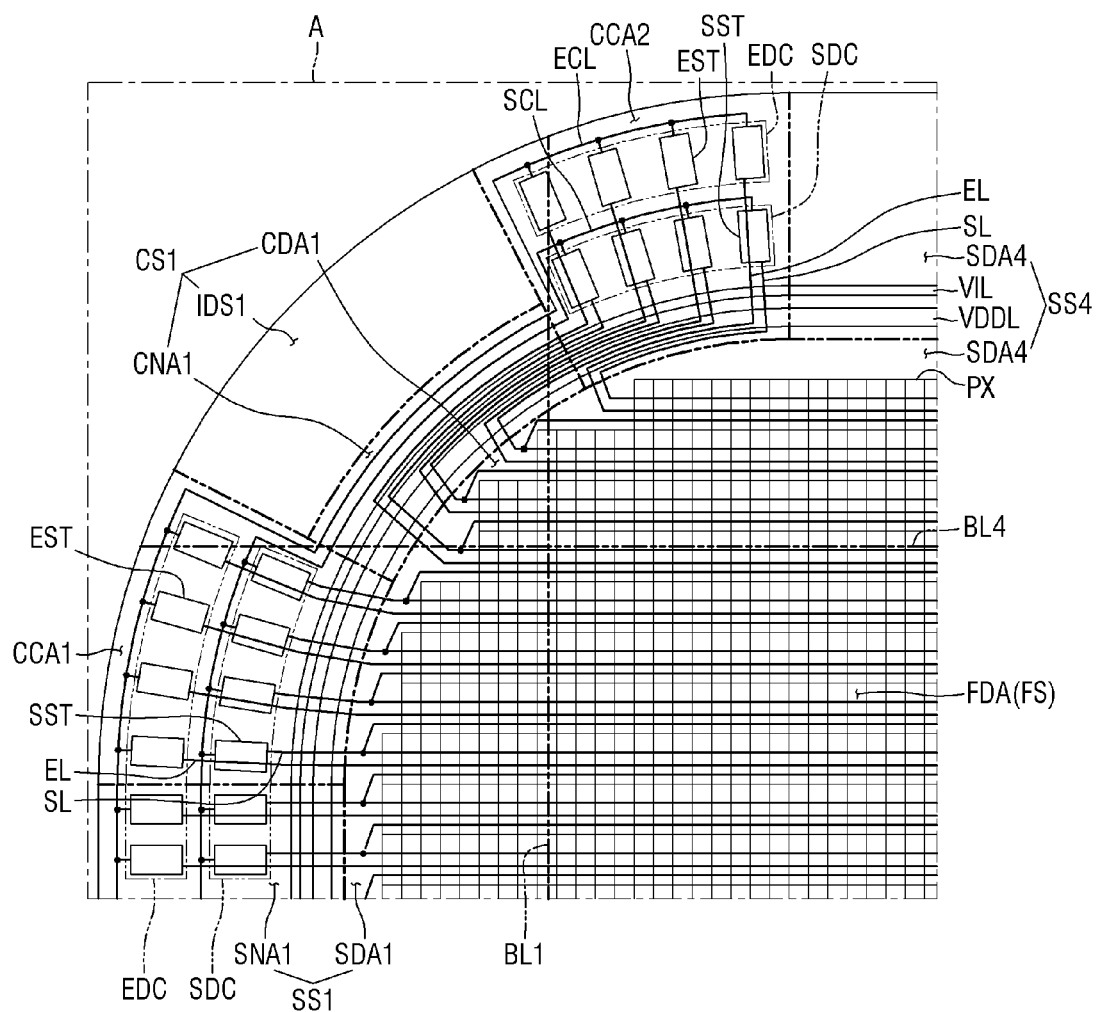
FIG. 18 is a view showing a layout of a first corner according to yet another alternative embodiment.

FIG. 18 is a view showing a layout of a first corner according to yet another alternative embodiment, where the non-display area is reduced from the second exemplary embodiment.

The embodiment of FIG. 18 is substantially the same as the embodiment of FIG. 13A except that a first corner non-display area CNA1 of a first corner CS1 is disposed adjacent to a first corner display area CDA1, and that a first corner CS1 further includes a first idle space IDS1 disposed on the outer side of the first corner non-display area CNA1. For convenience of description, any repetitive detailed description of the same or like elements as those described above with reference to FIG. 13A will hereinafter be omitted or simplified.

Referring to FIG. 18, the first corner non-display area CNA1 is disposed on the outer side of the first corner display area CDA1. The first corner non-display area CNA1 is disposed between the first corner display area CDA1 and the first idle space IDS1.

The scan control line SCL and the emission control line ECL of the first corner non-display area CNA1 may be disposed closer to the first corner display area CDA1 than the edge of the display panel 100. In such an embodiment, the first supply voltage line VDDL and the second supply voltage line VIL may be disposed closer to the first corner display area CDA1 than to the edge of the display panel 100.

The first idle space IDS1 may be disposed on the outer side of the first corner non-display area CNA1. The first idle space IDS1 may be the edge of the first corner CS1. None of the elements of the display panel 100 may be disposed in the first idle space IDS1. In addition, the substrate of the display panel 100 may be removed from the first idle space IDS1.

In an embodiment, as shown in FIG. 18, the first corner non-display area NDA1 is reduced in the first corner CS1, so that t the first idle space IDS1 is defined in the first corner CS1. Accordingly, since the light-blocking area of the cover window disposed on the display panel 100 may not cover the first idle space IDS1, the non-display area of the first corner CS1 recognized by the user may be reduced.

Figure 19:
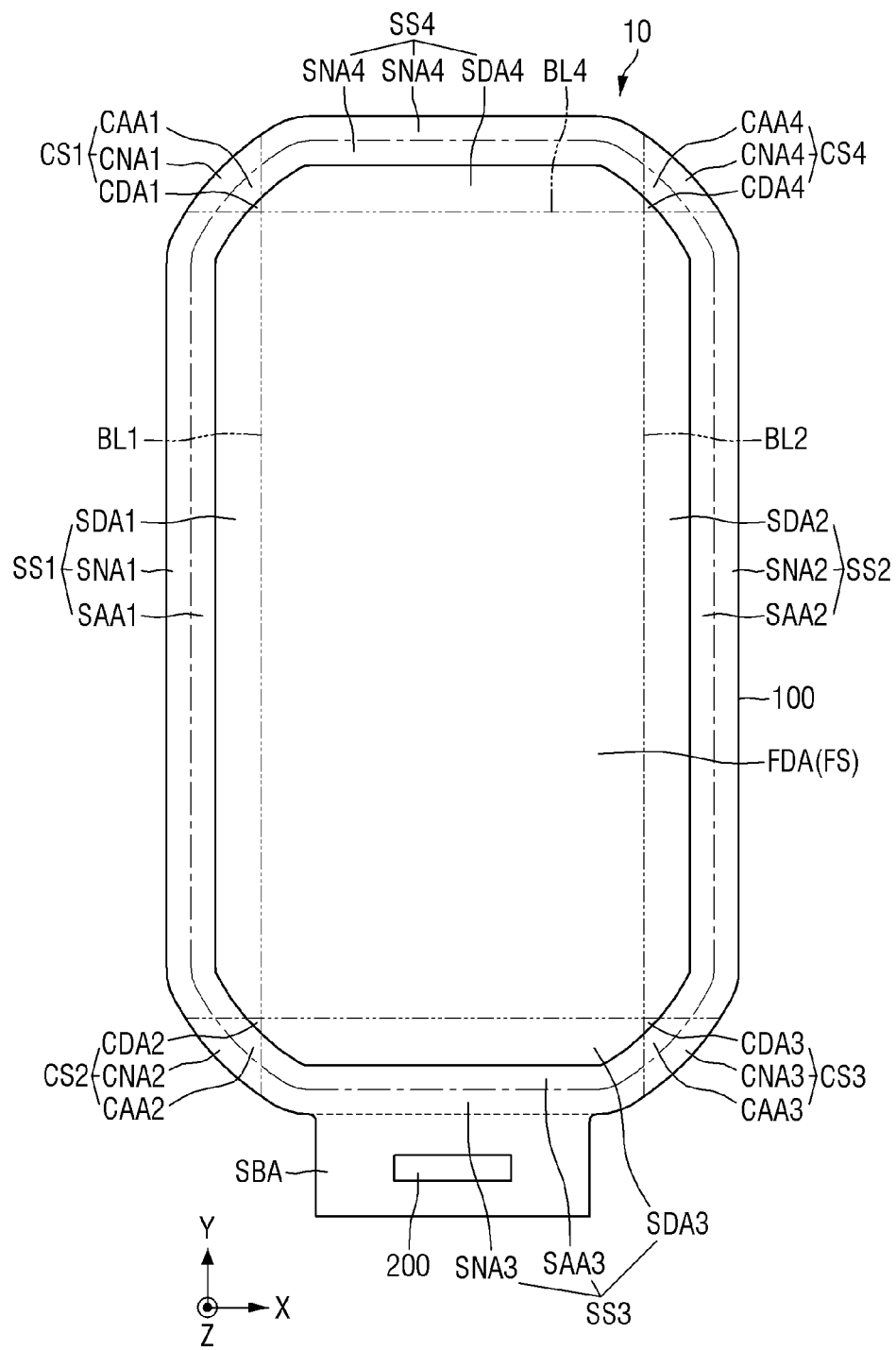
FIG. 19 is a view showing a layout of a display device according to yet another alternative embodiment of the disclosure.

FIG. 19 is a view showing a layout of a display device according to yet another alternative embodiment of the disclosure. FIG. 19 is a development view of a display device 10 according to yet another alternative embodiment of the disclosure.

The embodiment of FIG. 19 is substantially the same as the embodiment of FIG. 4 except that auxiliary display areas SAA1, SAA2, SAA3, SAA4, CAA1, CAA2, CAA3 and CAA4 are disposed between display areas SDA1, SDA2, SDA3, SDA4, CDA1, CDA2, CDA3 for CDA4 and non-display areas SNA1, SNA2, SNA3, SNA4, CNA1, CNA2, CNA3 and CNA4 of the display panel 100. Description will focus on the differences.

Referring to FIG. 19, a first side surface SS1 further includes a first side auxiliary display area SAA1 disposed between the first side display area SDA1 and the first side non-display area SNA1, and a second side surface SS2 further includes a second side auxiliary display area SAA2 disposed between the second side display area SDA2 and the second side non-display area SNA2. The third side surface SS3 further includes a third side auxiliary display area SAA3 disposed between the third side display area SDA3 and the third side non-display area SNA3, and a fourth side surface SS4 further includes a fourth side auxiliary display area SAA4 disposed between the fourth side display area SDA4 and the fourth side non-display area SNA4.

In such an embodiment, a first corner CS1 further includes a first corner auxiliary display area CAA1 disposed between the first corner display area CDA1 and the first corner non-display area CNA1, and a second corner CS2 further includes a second corner auxiliary display area CAA2 disposed between the second corner display area CDA2 and the second corner non-display area CNA2. A third corner CS3 further includes a third corner auxiliary display area CAA3 disposed between the third corner display area CDA3 and the third corner non-display area CNA3, and a fourth corner CS4 further includes a fourth corner auxiliary display area CAA4 disposed between the fourth corner display area CDA4 and the fourth corner non-display area CNA4.

Each of the side auxiliary display areas SAA1, SAA2, SAA3 and SAA4 and the corner auxiliary display areas CAA1, CAA2, CAA3 and CAA4 may include at least one selected from a scan driver circuit SDC, an emission driver circuit EDC, a first supply voltage VDDL, a second supply voltage line VIL, a scan control line SCL, and an emission control line ECL. Accordingly, the area where the pixels PX in each of the side auxiliary display areas SAA1, SAA2, SAA3 and SAA4 and the corner auxiliary display areas CAA1, CAA2, CAA3 and CAA4 are disposed may be reduced than the area where the pixels PX are disposed in the front display area FDA, side display areas SDA1, SDA2, SDA3 and SDA4, and corner display areas CDA1, CDA2, CDA3 and CDA4.

Accordingly, the number of pixels per unit area (e.g., pixels per inch, "PPI") in each of the side auxiliary display areas SAA1, SAA2, SAA3 and SAA4 may be less than the number of pixels per unit area in the front display area FDA, side display areas SDA1, SDA2, SDA3 and SDA4, and corner display areas CDA1, CDA2, CDA3 and CDA4. The unit area may be a predetermined area for calculating the number of pixels, for example, an area equal to one inch in the first direction (X-axis direction) and one inch in the second direction (Y-axis direction). In addition, the resolution of each of the side auxiliary display areas SAA1, SAA2, SAA3 and SAA4 and the corner auxiliary display areas CAA1, CAA2, CAA3 and CAA4 may be less than the resolution of the front display area FDA, side display areas SDA1, SDA2, SDA3 and SDA4, and corner display areas CDA1, CDA2, CDA3 and CDA4.

In an embodiment, as shown in FIG. 19, due to the side auxiliary display areas SAA1, SAA2, SAA3 and SAA4 and the corner auxiliary display areas CAA1, CAA2, CAA3 and CAA4, the side non-display areas SNA1, SNA2, SNA3 and SNA4 and the corner non-display areas CNA1, CNA2, CNA3 and CNA4 may be reduced, and the display area where images are displayed may be increased.

Figure 20:
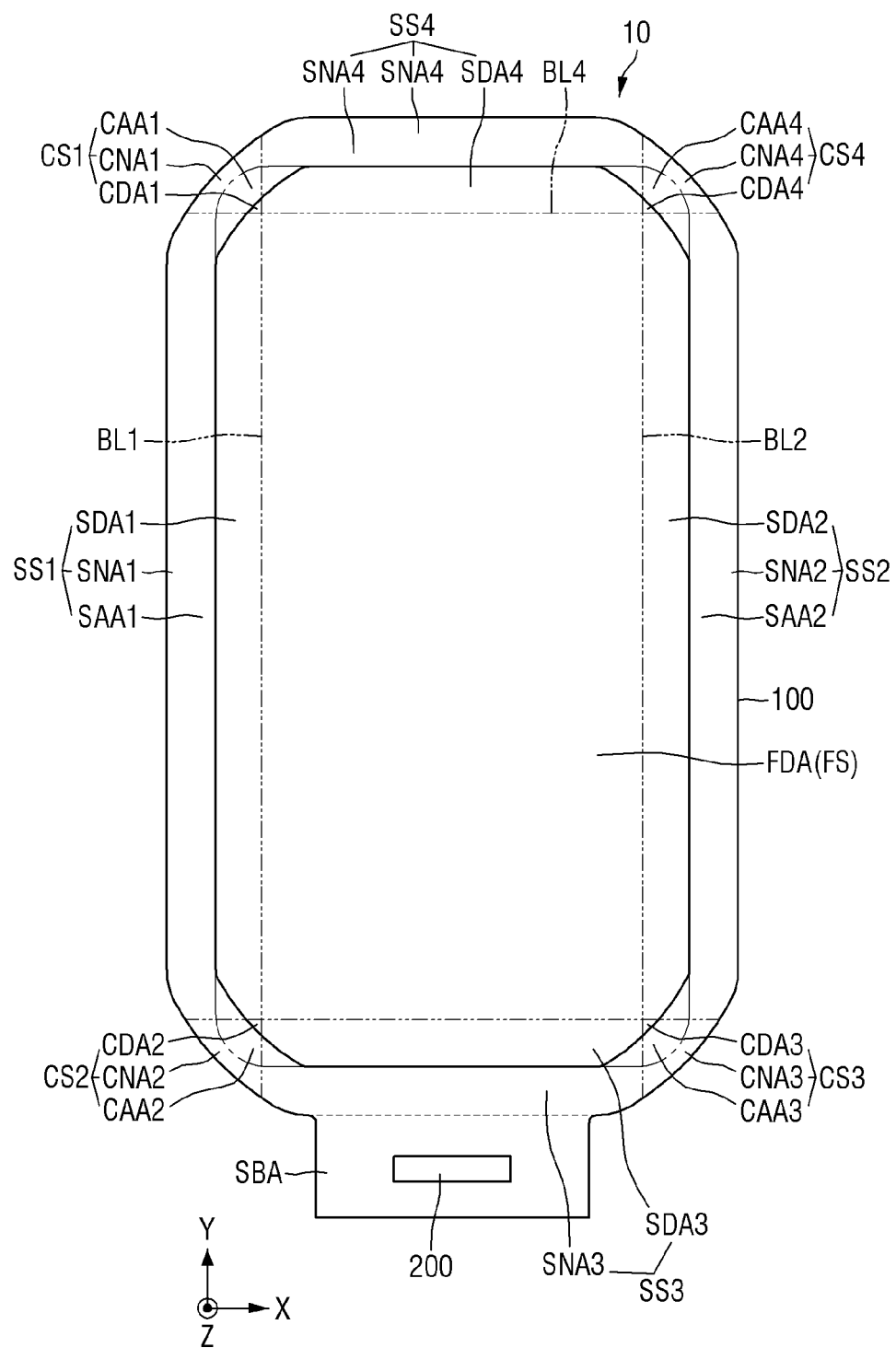
FIG. 20 is a view showing a layout of a display device according to yet another alternative embodiment of the disclosure.

FIG. 20 is a view showing a layout of a display device according to yet another alternative embodiment of the disclosure.

The embodiment of FIG. 20 is substantially the same as the embodiment of FIG. 19 except that corner auxiliary display areas CAA1, CAA2, CAA3 and CAA4 are disposed only between the corner display areas CDA1, CDA2, CDA3 and CDA4 and the corner non-display areas CNA1, CNA2, CNA3 and CNA4. Description will focus on the differences.

Referring to FIG. 20, a first corner CS1 further includes a first corner auxiliary display area CAA1 disposed between the first corner display area CDA1 and the first corner non-display area CNA1, and a second corner CS2 further includes a second corner auxiliary display area CAA2 disposed between the second corner display area CDA2 and the second corner non-display area CNA2. A third corner CS3 further includes a third corner auxiliary display area CAA3 disposed between the third corner display area CDA3 and the third corner non-display area CNA3, and a fourth corner CS4 further includes a fourth corner auxiliary display area CAA4 disposed between the fourth corner display area CDA4 and the fourth corner non-display area CNA4.

Each of the corner auxiliary display areas CAA1, CAA2, CAA3 and CAA4 may include at least one of a scan driver circuit SDC, an emission driver circuit EDC, a first supply voltage line VDDL, a second driving voltage line VIL, a scan control line SCL, and an emission control line ECL of FIG. 5A. Accordingly, the area where the pixels PX in each of the corner auxiliary display areas CAA1, CAA2, CAA3 and CAA4 are disposed may be reduced compared to the area where the pixels PX are disposed in the front display area FDA, side display areas SDA1, SDA2, SDA3 and SDA4, and corner display areas CDA1, CDA2, CDA3 and CDA4.

Therefore, the number of pixels per unit area (e.g., PPI) in each of the corner auxiliary display areas CAA1, CAA2, CAA3 and CAA4 may be smaller than the number of pixels per unit area in the front display area FDA, side display areas SDA1, SDA2, SDA3 and SDA4, and corner display areas CDA1, CDA2, CDA3 and CDA4. In addition, the resolution of each of the corner auxiliary display areas CAA1, CAA2, CAA3 and CAA4 may also be less than the resolution of the front display area FDA, side display areas SDA1, SDA2, SDA3 and SDA4, and corner display areas CDA1, CDA2, CDA3 and CDA4.

In an embodiment, as shown in FIG. 20, the area of the corner non-display areas CNA1, CNA2, CNA3 and CNA4 may be reduced due to the corner auxiliary display areas CAA1, CAA2, CAA3 and CAA4, and the area of the display area where an image is displayed may be increased. In such an embodiment, the minimum width of each of the corner non-display areas CNA1, CNA2, CNA3 and CNA4 may be less than the minimum width of each of the side non-display areas SNA1, SNA2, SNA3 and SNA4.

In embodiments of the display device, dummy stages are eliminated in the circuit areas, in which the stages are disposed, so that the non-display area may be reduced and the display area may be added as much as the non-display area is reduced.

Further, in embodiments of the display device, the dummy stages are eliminated from the corner, and the stages are disposed in the circuit areas. Therefore, the non-display area of the corner may be reduced, and an idle space may be defined in the corner as much as the non-display area is reduced. Accordingly, a light-blocking area of a cover window disposed on a display panel may not cover the idle space, and thus the non-display area recognized by a user see may be reduced.

The invention should not be construed as being limited to the embodiments set forth herein. Rather, these embodiments are provided so that this invention will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:
1. A display device comprising:
a display area including pixels;
a non-display area adjacent to the display area;
scan lines connected to the pixels;
emission lines connected to the pixels;
a scan control line to which a scan control signal is applied;
an emission control line to which an emission control signal is applied;
a first scan driver circuit disposed in the non-display area, wherein the first scan driver circuit is connected to first scan lines among the scan lines and the scan control line;
a second scan driver circuit disposed in the non-display area, wherein the second scan driver circuit is connected to second scan lines among the scan lines and the scan control line; and
a first emission driver circuit connected to first emission lines among the emission lines and the emission control line, wherein the first scan driver circuit, the first emission driver circuit and the second scan driver circuit are arranged sequentially from the display area in one direction, wherein the second scan driver circuit is disposed farther away from the display area than the first emission driver circuit is, and wherein the first emission driver is disposed farther away from the display area than the first scan driver circuit is.

2. The display device of claim 1, wherein one of the second scan lines is bent more times than one of the first scan lines.

3. The display device of claim 1, further comprising:
a first supply voltage line disposed between the first scan driver circuit and the display area, where the first supply voltage line applies a first supply voltage.

4. The display device of claim 3, further comprising:
a second supply voltage line disposed between the first scan driver circuit and the display area, wherein the second supply voltage line applies a second supply voltage.

5. The display device of claim 4, wherein each of the first scan lines and the second scan lines intersects the first supply voltage line and the second supply voltage line.

6. The display device of claim 1, further comprising:
a second emission driver circuit disposed in the non-display area, wherein the second emission driver is connected to second emission lines among the emission lines, and outputs second emission signals to the second emission lines, wherein the first emission driver circuit outputs first emission signals to the first emission lines, and wherein the first emission driver circuit and the second emission driver circuit are disposed between the first scan driver circuit and the second scan driver circuit.

7. The display device of claim 6, wherein the second emission driver circuit is disposed farther away from the display area than the first emission driver circuit.

8. The display device of claim 7, wherein one of the second emission lines is bent more times than one of the first emission lines.

9. The display device of claim 6, wherein
the emission control line is disposed between the first emission driver circuit and the second emission driver circuit, and
the emission control lines is connected to the first emission driver circuit and the second emission driver circuit.

10. The display device of claim 6, wherein the scan control line comprises:
a first scan control line disposed between the first scan driver circuit and the first emission driver circuit, wherein the first scan control lines is connected to the first scan driver circuit; and
a second scan control line disposed on a side of the second scan driver circuit, wherein the second scan control line is connected to the second scan driver circuit,
wherein the second emission driver circuit is disposed on an opposite side of the second scan driver circuit.

11. The display device of claim 6, wherein the non-display area further comprises:
circuit areas in which the first scan driver circuit, the second scan driver circuit, the first emission driver circuit, and the second emission driver circuit are disposed; and
a corner non-display area disposed between the driver circuit areas, wherein the display area comprises a protruding display area disposed surrounded by a bay area defined by the driver circuit areas and the corner non-display area.

12. The display device of claim 11, wherein the second scan lines and the second emission lines are connected to pixels disposed in the protruding display area.

13. The display device of claim 11, wherein a width of one of the circuit areas is greater than a width of the corner non-display area.

14. A display device comprising:
a display panel comprising a front surface, a first side surface extended from a first side of the front surface, a second side surface extended from a second side surface of the front surface, and a corner disposed between the first side surface and the second side surface;
a display area in which pixels are disposed;
a non-display area adjacent to the display area, wherein the non-display area comprises a first circuit area and a second circuit area;
first scan lines connected to first pixels among the pixels;
second scan lines connected to second pixels among the pixels;
a scan driver circuit connected to the first scan lines and the second scan lines, wherein the scan driver circuit is disposed in each of the first circuit area and the second circuit area; and
a first supply voltage line disposed between the scan driver circuit and the display area,
wherein an area where one of the second scan lines overlaps the first supply voltage line is larger than an area where one of the first scan lines overlaps the first supply voltage line, and
wherein a portion of the display area is disposed between the first circuit area and the second circuit area at the corner.

15. The display device of claim 14, wherein the second can lines are bent more times than the first scan lines.

16. The display device of claim 14, further comprising:
a second supply voltage line disposed between the scan driver circuit and the display area, wherein the second supply voltage line applies a second supply voltage.

17. The display device of claim 16, wherein the area where another one of the second scan lines overlaps the second supply voltage line is greater than the area where another one of the first scan lines overlaps the second supply voltage line.

18. The display device of claim 14, further comprising:
first emission lines connected to the first pixels;
second emission lines connected to the second pixels; and
an emission driver circuit connected to the first emission lines and the second emission lines, wherein the emission driver circuit outputs the first emission signals and the second emission signals.

19. The display device of claim 18, wherein an area where one of the second emission lines overlaps the first supply voltage line is greater than an area where one of the first emission lines overlaps the first supply voltage line.

20. The display device of claim 18, wherein the second emission lines are bent more times than the first emission lines.

21. The display device of claim 18, wherein the non-display area adjacent to the display area comprises:
a corner non-display area disposed between the first and second circuit areas, wherein the display area comprises a protruding display area disposed surrounded by a bay area defined by the first and second circuit areas and the corner non-display area.

22. The display device of claim 21, wherein the second scan lines and the second emission lines are connected to pixels disposed in the protruding display area.

23. A display device comprising:
a display panel comprising a front surface, a first side surface extended from a first side of the front surface, a second side surface extended from a second side surface of the front surface, and a corner disposed between the first side surface and the second side surface,
wherein the corner comprises:
a corner display area where pixels for displaying images are disposed; and
a corner auxiliary display area adjacent to the corner display area where the pixels are disposed,
wherein a number of pixels per unit area in the corner display area is greater than a number of pixels per unit area in the corner auxiliary display area.

24. The display device of claim 23,
wherein the first side surface comprises a first side display area where the pixels are disposed and a first side non-display area adjacent to the first side display area,
wherein the corner further comprises a corner non-display area adjacent to the corner auxiliary display area, and
wherein a width of the first side non-display area is greater than a width of the corner non-display area.

* * * * *